US011799062B2

(12) United States Patent
Nakabayashi

(10) Patent No.: US 11,799,062 B2
(45) Date of Patent: *Oct. 24, 2023

(54) METHOD OF PRODUCING LIGHT SOURCE DEVICE COMPRISING JOINING A WIRING PORTION OF A LIGHT EMITTING DEVICE AND A SUPPORT SUBSTRATE BY A SOLDER MEMBER

(71) Applicant: NICHIA CORPORATION, Anan (JP)

(72) Inventor: Takuya Nakabayashi, Tokushima (JP)

(73) Assignee: NICHIA CORPORATION, Anan (JP)

( * ) Notice: Subject to any disclaimer, the term of this patent is extended or adjusted under 35 U.S.C. 154(b) by 94 days.

This patent is subject to a terminal disclaimer.

(21) Appl. No.: 17/450,621

(22) Filed: Oct. 12, 2021

(65) Prior Publication Data

US 2022/0029066 A1    Jan. 27, 2022

Related U.S. Application Data

(63) Continuation of application No. 16/567,468, filed on Sep. 11, 2019, now Pat. No. 11,171,272.

(30) Foreign Application Priority Data

Sep. 12, 2018 (JP) .................................. 2018-170437

(51) Int. Cl.
*H01L 33/62* (2010.01)
*H01L 33/56* (2010.01)

(52) U.S. Cl.
CPC .............. *H01L 33/62* (2013.01); *H01L 33/56* (2013.01); *H01L 2933/0066* (2013.01)

(58) Field of Classification Search
CPC .. H01L 33/62; H01L 33/56; H01L 2933/0066
(Continued)

(56) References Cited

U.S. PATENT DOCUMENTS 5,001,605 A    3/1991 Savagian et al.
11,171,272 B2 * 11/2021 Nakabayashi .......... H01L 33/56
(Continued)

FOREIGN PATENT DOCUMENTS

JP    2013041865 A    2/2013
JP    2015144205 A    8/2015
(Continued)

OTHER PUBLICATIONS

Non-Final Office Action, U.S. Appl. No. 16/567,468 dated Mar. 18, 2021, 12 pages.
(Continued)

*Primary Examiner* — Sheng-Bai Zhu
(74) *Attorney, Agent, or Firm* — Hunton Andrews Kurth LLP

(57) ABSTRACT

A method of producing a light source device includes providing a light emitting device having a substrate including a base member that includes a bottom surface and a recess. The substrate further including a wiring portion in the recess. The method further including providing a support substrate having a support base member, a first wiring pattern on a top surface of the support base member and including a joining region, and an insulating region, and applying a solder member such that the solder member on the insulating region has a volume larger than that of the solder member on the joining region. The light emitting device is placed on the support substrate while the solder member is separate from a portion of the wiring portion positioned in the vicinity of the bottom surface and the wiring portion is joined to the joining region.

20 Claims, 14 Drawing Sheets

(58) Field of Classification Search
USPC .......................................................... 257/79
See application file for complete search history.

(56) References Cited

U.S. PATENT DOCUMENTS

| | | |
|---|---|---|
| 2013/0037847 A1 | 2/2013 | Sugiura et al. |
| 2014/0092569 A1 | 4/2014 | Sakurai |
| 2018/0080641 A1 | 3/2018 | Tanaka et al. |
| 2018/0226385 A1 | 8/2018 | Nakabayashi et al. |
| 2020/0083421 A1 | 3/2020 | Nakabayashi |

FOREIGN PATENT DOCUMENTS

| | | | |
|---|---|---|---|
| JP | 2018049953 A | | 3/2018 |
| WO | WO 2017056321 | * | 4/2017 |

OTHER PUBLICATIONS

Notice of Allowance, U.S. Appl. No. 16/567,468 dated Jul. 12, 2021, 8 pages.

* cited by examiner

METHOD OF PRODUCING LIGHT SOURCE DEVICE COMPRISING JOINING A WIRING PORTION OF A LIGHT EMITTING DEVICE AND A SUPPORT SUBSTRATE BY A SOLDER MEMBER

CROSS REFERENCE TO RELATED APPLICATION

This is a continuation application of U.S. patent application Ser. No. 16/567,468, filed Sep. 11, 2019, which claims priority to Japanese Patent Application No. 2018-170437, filed on Sep. 12, 2018, the disclosure of which is hereby incorporated by reference in its entirety.

BACKGROUND

The present disclosure relates to a method of producing a light source device.

A light emitting diode including a substrate that includes a base portion defining a cutout portion (i.e., an opening) and a mounting portion located on the base portion so as to close the cutout portion, and also including an electrode exposed from the cutout portion is known. In such a light emitting diode, the electrode and a motherboard are electrically joined to each other by solder (see, for example, Japanese Patent Publication No. 2013-041865).

SUMMARY

In certain general aspects, a method of producing a light source device includes the steps of: providing a light emitting device including a substrate including a base member having a front surface extending in a longitudinal direction and a short-side direction perpendicular to the longitudinal direction, a rear surface positioned opposite to the front surface, a top surface adjacent to the front surface and perpendicular to the front surface, a bottom surface positioned opposite to the top surface, and a plurality of recessed portions opened on the rear surface and the bottom surface, the substrate further including a first wiring portion located on the front surface, and a second wiring portion electrically connected with the first wiring portion and located in the plurality of recessed portions; and a light emitting element electrically connected with the first wiring portion and located on the first wiring portion; providing a support substrate including a support base member, a first wiring pattern located on a top surface of the support base member and including a joining region, and an insulating region enclosing the joining region; applying a solder member on the joining region and the insulating region such that a portion of the solder member positioned on the insulating region has a volume larger than a volume of a portion of the solder member positioned on the joining region; placing the light emitting device on the support substrate while the solder member and a portion of the second wiring portion that is positioned in the vicinity of the bottom surface are separate from each other as seen in a plan view; and joining the second wiring portion of the light emitting device and the joining region of the support substrate to each other by melting the solder member through heating.

According to the above aspect, it is possible to provide a method of producing a light source device which is less likely to be inclined with respect to the support substrate, such as a motherboard, for example, when being joined with the support substrate.

DETAILED DESCRIPTION

Figure 1A:
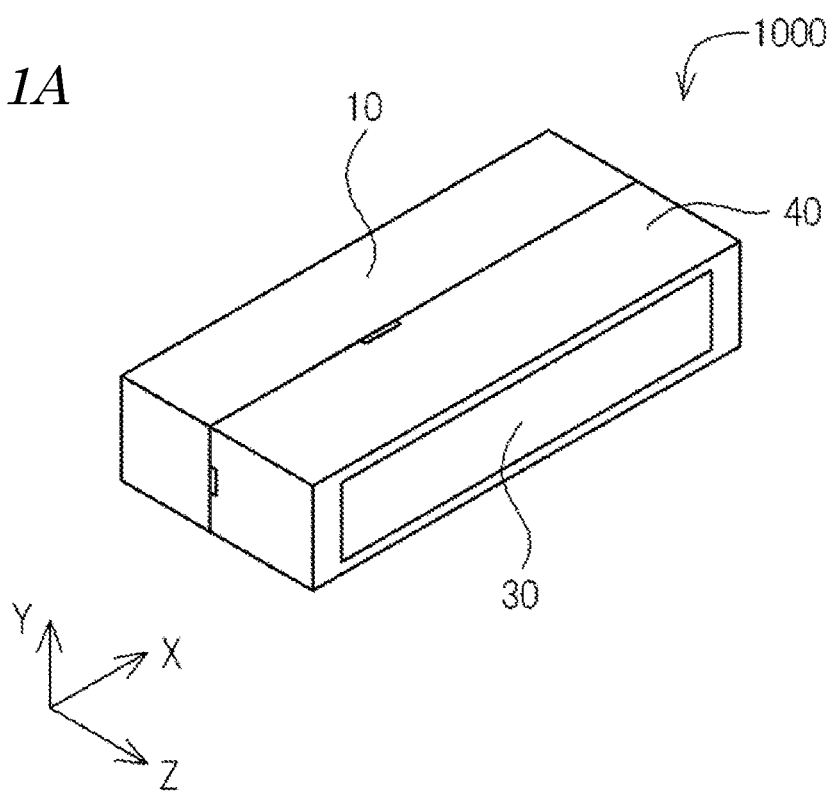
FIG. 1A is a schematic perspective view of a light emitting device according to a first embodiment.

Hereinafter, embodiments of the present disclosure will be described with reference to the attached drawings. Light emitting devices described below embody certain technological ideas of the present invention, and the present invention is not limited to any of the following embodiments unless otherwise specified. A content described in one embodiment is applicable to other embodiments and modifications. In the drawings, the size, positional arrangement or the like may be exaggerated for clear illustration.

Embodiment 1

With reference to FIG. 1A through FIG. 11, a method of producing a light source device according to embodiment 1 of the present disclosure will be described.

The method of producing a light source device according to embodiment 1 includes the steps of:

(1) The step of providing a light emitting device including:
  a substrate including a base member having:
    a front surface extending in a longitudinal direction and a short-side direction perpendicular to the longitudinal direction,
    a rear surface positioned opposite to the front surface,
    a top surface adjacent to the front surface and perpendicular to the front surface,
    a bottom surface positioned opposite to the top surface, and
    a recessed portion opened on the rear surface and the bottom surface,
  the substrate further including:
    a first wiring portion located on the front surface, and
    a second wiring portion electrically connected with the first wiring portion and located in the recessed portion; and
  at least one light emitting element electrically connected with the first wiring portion, and located on the first wiring portion;
(2) providing a support substrate including a support base member, a first wiring pattern located on a top surface of the support base member and including a joining region, and an insulating region enclosing the joining region;
(3) applying a solder member on the joining region and the insulating region such that a portion of the solder member positioned on the insulating region has a volume larger than a volume of a portion of the solder member positioned on the joining region;
(4) placing the light emitting device on the support substrate while the solder member and a portion of the second wiring portion positioned in the vicinity of the bottom surface are separate from each other as seen in a plan view; and
(5) joining the second wiring portion of the light emitting device and the joining region of the support substrate to each other by melting the solder member through heating.

According to the above-described method of producing a light source device in this embodiment, formation of heated and melted solder between the bottom surface of the base member and the top surface of the support substrate can be alleviated. This can alleviate the light emitting device to be inclined with respect to the support substrate when being joined with the support substrate.

Step of Preparing a Light Emitting Device

Figure 2A:
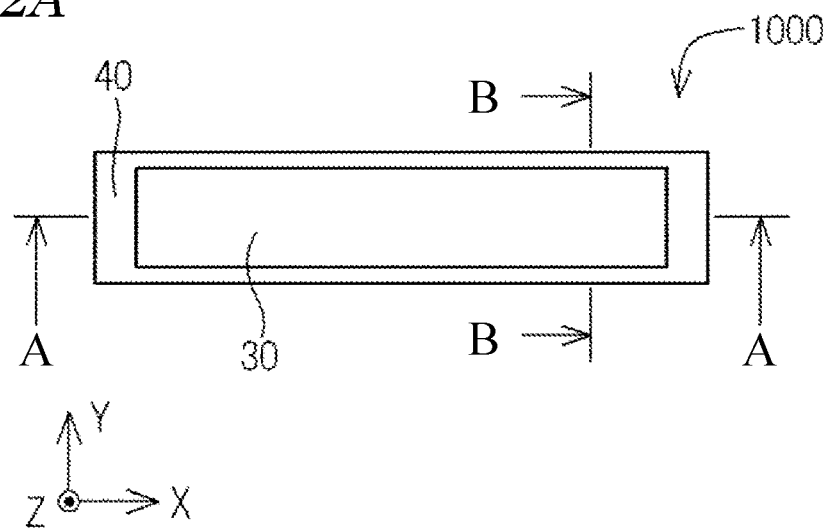
FIG. 2A is a schematic front view of the light emitting device according to the first embodiment.
Figure 2B:
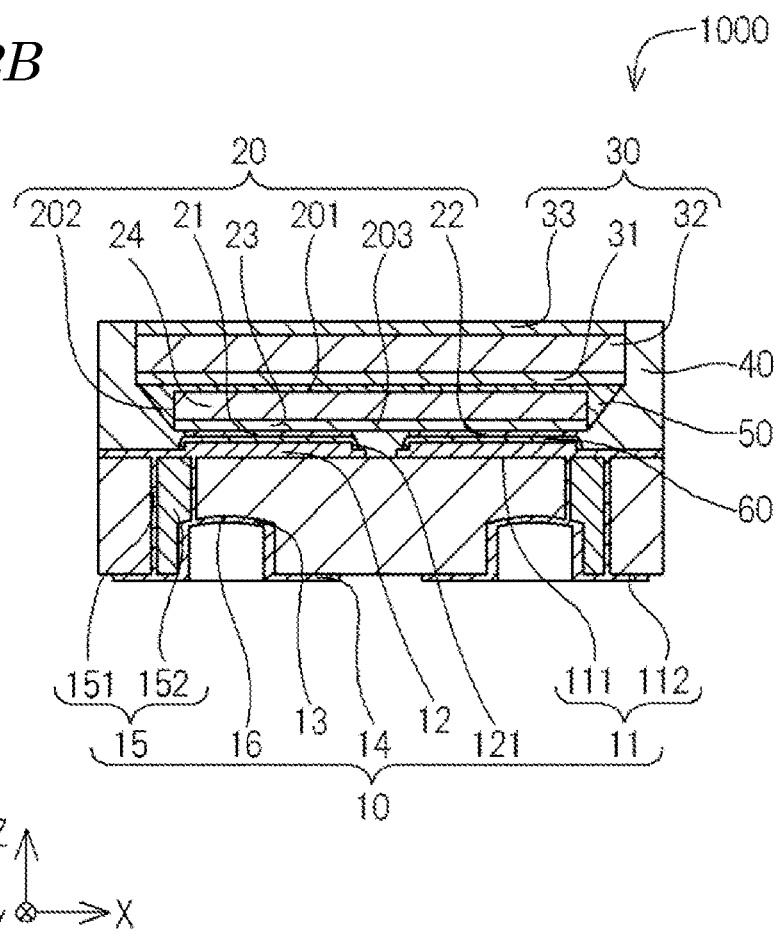
FIG. 2B is a schematic cross-sectional view taken along line A-A in FIG. 2A.
Figure 2C:
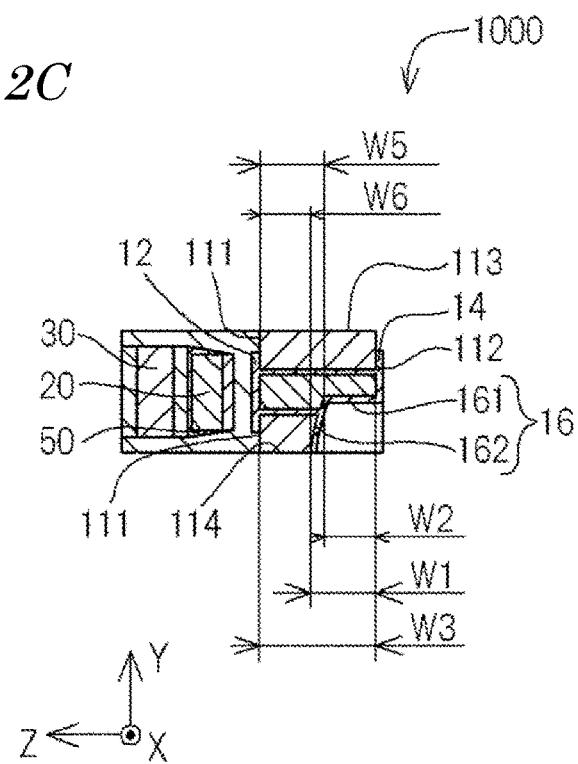
FIG. 2C is a schematic cross-sectional view taken along line B-B in FIG. 2A.

As shown in FIG. 2B, a light emitting device 1000 including a substrate 10 and at least one light emitting element 20 is provided. The substrate 10 includes a base member 11, first wiring portions 12 and second wiring portions 13. The base member 11 includes a front surface 111 extending in a longitudinal direction and in a short-side direction perpendicular to the longitudinal direction, a rear surface 112 positioned opposite to the front surface 111. As shown in FIG. 2C, the base member 11 further includes a top surface 113 adjacent to the front surface 111 and perpendicular to the front surface 111, and a bottom surface 114 positioned opposite to the top surface 113. In this specification, the term "perpendicular" indicates that a tolerance of about 90°±3° is allowed. In this specification, the longitudinal direction may be referred to as the "X direction," the short-side direction may be referred to as the "Y direction," and the direction from the rear surface 112 toward the front surface 111 and its vice versa may be referred to as the "Z direction."

Figure 1B:
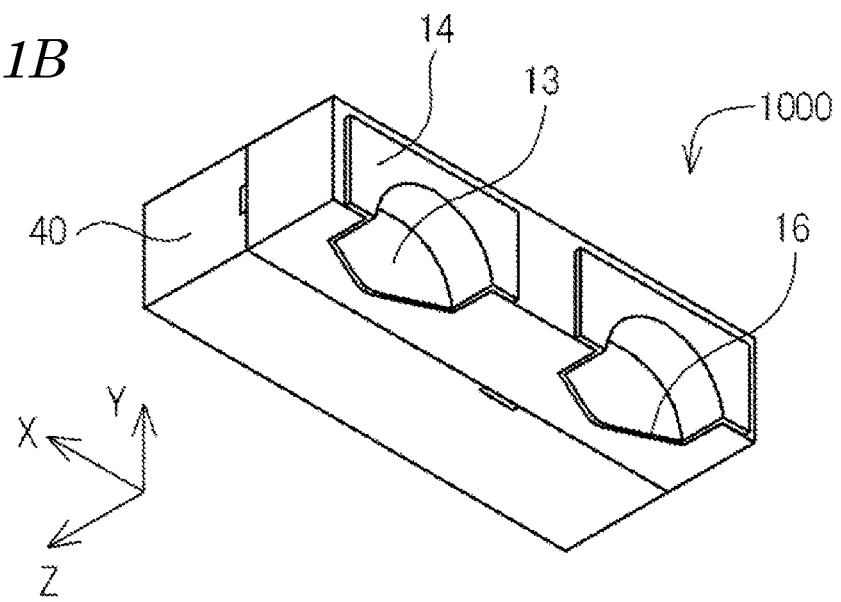
FIG. 1B is another schematic perspective view of the light emitting device according to the first embodiment.

The base member 11 includes at least one recessed portion 16 opened on the rear surface 112 and the bottom surface 114. In this example, the base member 11 has two recessed portions 16 as shown in FIG. 1B and FIG. 2B. The first wiring portions 12 are located on the front surface 111 of the base member 11.

The second wiring portions 13 are located in the corresponding one of the recessed portions 16 and the respective second wiring portion 13 is electrically connected with the corresponding one of the first wiring portions 12. Each of the second wiring portion 13 has a portion that is positioned in the vicinity of the bottom surface 114 of the base member 11. In this specification, the "portion of the second wiring portion 13 that is positioned in the vicinity of the bottom surface 114 of the base member 11" indicates a portion of the second wiring portion 13 that is flush with the bottom surface 114 of the base member 11.

Each second wiring portion 13 of the base member 11 and a joining region, which is a part of a wiring pattern of a support substrate, are joined by a solder member. With the structure in which the light emitting device 1000 includes the plurality of second wiring portions 13, the joining strength between the light emitting device 1000 and the support substrate can be made enhanced compared to a light emitting device in which only one second wiring portion 13 is provided.

There is no specific requirement on the depth of each of the plurality of recessed portions 16. Regarding the depth of each of the plurality of recessed portions 16 in the Z direction, it is preferable that as shown in FIG. 2C, the depth W1 that is on the bottom surface 114 side is greater than the depth W2 that is on the top surface 113 side. With such a structure, the base member 11 can be larger in the Z direction at the thickness W5 that is on the top surface 113 side with respect to the recessed portions 16 than the thickness W6 that is on the bottom surface 114 side with respect to the recessed portions 16. This can alleviate a decrease in the strength of the base member 11.

The recessed portion 16 has the depth W1 on the bottom surface 114 side greater in the Z direction than the depth W2 on the top surface 113 side. This can increase the surface area size of the opening of the recessed portion 16 at the bottom surface 114 of the base member 11. The light emitting device 1000 and the support substrate are joined to each other by the solder member in the state where the bottom surface 114 of the base member 11 and a top surface of the support substrate face each other. With this structure, the surface area size of the opening of the recessed portion 16 at the bottom surface 114 of the base member 11, which faces the support substrate, is increased. Thus a portion of the solder member that is positioned on the bottom surface 114 side of the base member 11 can have an increased surface area size. This can increase the joining strength between the light emitting device 1000 and the support substrate.

The recessed portions 16 may pass through the base member 11, or may not pass through the base member 11 as shown in FIG. 2B and FIG. 2C. In the case where the recessed portions 16 do not pass through the base member 11, the base member 11 can have a higher strength than in the case where the recessed portions 16 pass through the base member 11. In the case where the recessed portions 16 do not pass through the base member 11, it is preferable that a maximum depth of each of the plurality of recessed portions 16 in the Z direction is 0.4 to 0.8 times thickness W3 of the base member 11 in the Z direction. With the structure in which the depth of the recessed portion 16 is larger than 0.4 times the thickness W3 of the base member 11, larger amount of the solder member can be formed in each recessed portion 16. This can increase the joining strength between the light emitting device 1000 and the support substrate. With the structure in which the depth of the recessed portion 16 is smaller than 0.8 times the thickness W3 of the base member 11, the base member 11 can have an increased strength.

As seen in a cross-sectional view, it is preferred that the recessed portions 16 each include a parallel portion 161 extending in the Z direction. The provision of the parallel portion 161 can increase the volumetric capacity of the recessed portion 16 compared to a recessed portion without parallel portion 161 even if the surface area size of the opening of the recessed portion 16 at the rear surface 112 is the same. Such an increased volumetric capacity of the recessed portion 16 can increase the amount of solder that may be contained in the recessed portion 16. This can increase the joining strength between the light emitting device 1000 and the support substrate. In this specification, the term "parallel" indicates that a tolerance of about ±3° is allowed. As seen in a cross-sectional view, the recessed portions 16 may each include an inclining portion 162 inclining so as to increase the thickness of the base member 11 from the bottom surface 114. The inclining portion 162 may be defined by a straight line or a curved line. In the case of being defined by a straight line, the inclining portion 162 is formed easily by a drill with a pointed tip. The term "straight" used regarding the inclining portion 162 indicates that a tolerance of about ±3 µm is allowed.

Figure 3:
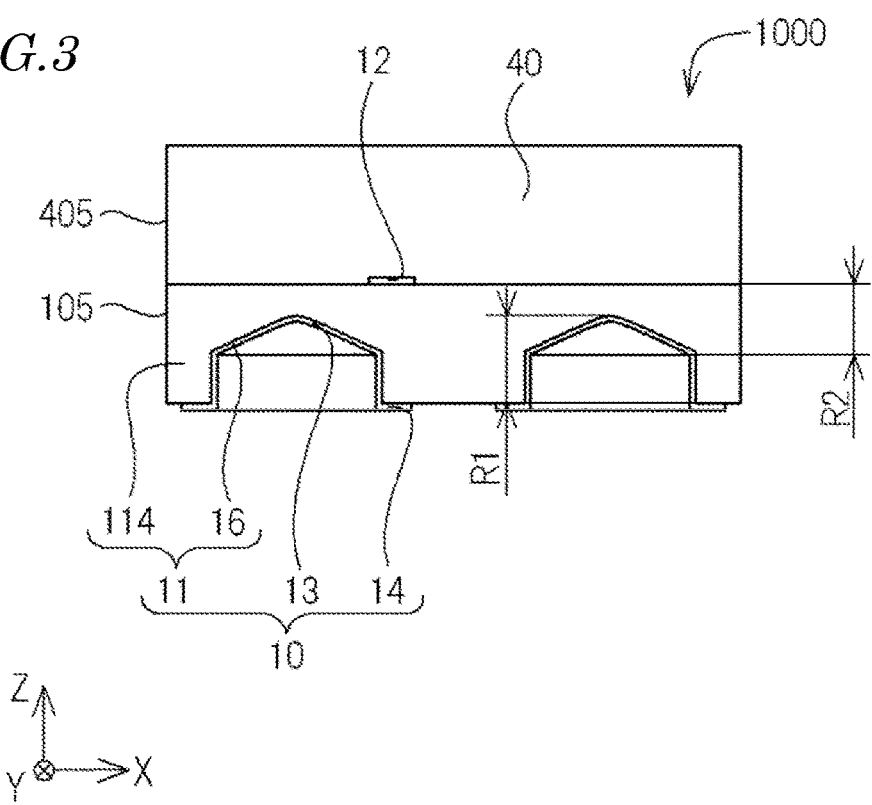
FIG. 3 is a schematic bottom view of the light emitting device according to the first embodiment.

It is preferred that as shown in FIG. 3, at the bottom surface 114 of the base member 11, depth R1 of a central portion of each of the recessed portions 16 is the maximum depth of the recessed portion 16 in the Z direction. With such a structure, thickness R2 of the base member 11 in the Z direction can be large at an end of the recessed portion 16 in the X direction on the bottom surface 114. This can increase the strength of the base member 11. In this specification, the term "central" indicates that a tolerance of about ±5 µm is allowed.

Figure 4A:
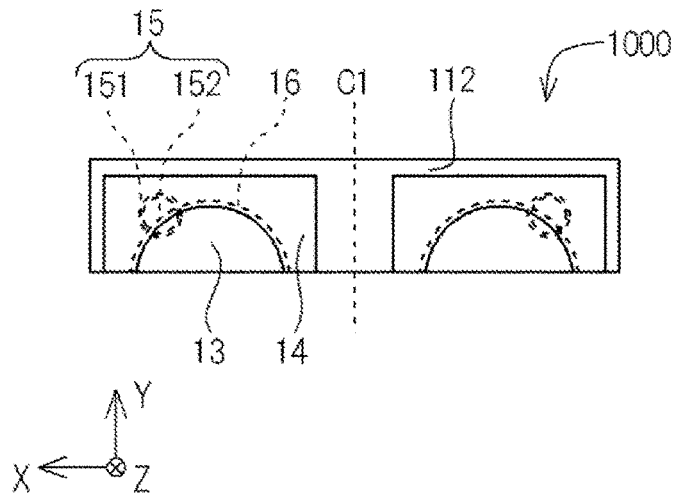
FIG. 4A is a schematic rear view of the light emitting device according to the first embodiment.
Figure 4B:
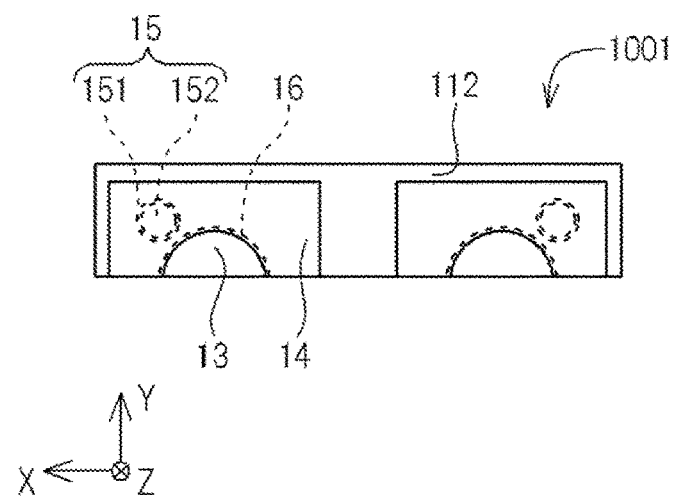
FIG. 4B is a schematic rear view of a modification of the light emitting device according to the first embodiment.

The recessed portions 16 may be formed by a known method such as drilling, laser processing or the like. The recessed portion 16 in which the depth R1 of the central portion is the maximum depth thereof at the bottom surface 114 can be formed easily by a drill with a pointed tip. Use of a drill can form a recessed portion having a deepest portion of a substantially conical shape, and also having a substantially cylindrical-shaped portion continued from the substantially conical shape. After a formation of a part of a recessed portion with such shape, a recessed portion having a deepest portion of a substantially semi-conical shape, and also having a substantially semi-cylindrical-shaped portion continued from the substantially semi-conical shape by cutting, for example, by dicing or the like, can be formed as shown in a cross-sectional view in FIG. 1B. With such an arrangement, as shown in FIG. 4A, the opening of the recessed portion 16 can have substantially semi-circular shape at the rear surface. The structure in which the opening of the recessed portion 16 is substantially semi-circular with no angular portion, a stress concentration to any particular position of the recessed portion 16 can be alleviated. This can alleviate breakage of the base member 11.

At the rear surface 112, the plurality of recessed portions 16 may have different shapes from each other, or as shown in FIG. 4A, may have the same shape as each other. In the case of having the same shape, the plurality of recessed portions 16 are formed more easily than in the case of having different shapes from each other. In the case where drilling is used, the plurality of recessed portions 16 having the same shape may be formed by one drill. In this specification, the term "same" indicates that a tolerance of about ±5 µm is allowed.

On the rear surface 112, it is preferable that as shown in FIG. 4A, the plurality of recessed portions 16 are positioned in a left-right symmetrical manner with respect to a center line C1, of the base member 11, parallel to the Y direction. With such a structure, in the step of joining the light emitting device 1000 to the support substrate with the solder member, the light emitting device 1000 is mounted on the support substrate with high precision by a self-alignment effect.

As shown in FIG. 2B, the substrate 10 may include one or more third wiring portions 14 located on the rear surface 112 of the base member 11. The substrate 10 may further include one or more vias 15 each electrically connecting the first wiring portion 12 and the third wiring portion 14 to each other. The vias 15 are each provided in a through-hole running between the front surface 111 and the rear surface 112 of the base member 11. The vias 15 may each include a fourth wiring portion 151 covering a wall of the through-hole in the base member 11 and a filling member 152 filling a space inside the fourth wiring portion 151. The filling member 152 may be conductive or insulating.

It is preferable that the filling member 152 is formed of a resin material. In general, a resin material before being cured has a higher fluidity than that of an uncured metal material before being cured, and thus easily fills the space enclosed by the fourth wiring portion 151. Therefore, use of a resin material for the filling member 152 makes it easy to produce the substrate 10. Examples of the resin material that easily fills such a space include an epoxy resin. In the case where a resin material is used for the filling member 152, it is preferable that the resin material contains an additive in order to decrease the coefficient of linear thermal expansion of the filling member 152. This decreases the difference in the coefficient of linear thermal expansion between the fourth wiring portion 151 and the filling member 152, and therefore, can alleviate generation of a gap between the fourth wiring portion 151 and the filling member 152 due to heat from the light emitting element 20. Examples of the additive include silicon oxide. In the case where a metal material is used for the filling member 152, heat dissipation can be improved.

As shown in FIG. 2B and FIG. 4A, each of the vias 15 and the corresponding recessed portion 16 may be in contact with each other. In the case where the via 15 and the recessed portion 16 are in contact with each other, the fourth wiring portion 151 and the second wiring portion 13 can be put into contact with each other. This can improve the heat dissipation of the light emitting device 1000. Alternatively, as in a light emitting device 1001 shown in FIG. 4B, each via 15 and the corresponding recessed portion 16 may be separate from each other. In the case where the via 15 and the recessed portion 16 are separate from each other, the strength of the base member 11 can be increased as compared with the case where the via 15 and the recessed portion 16 are in contact with each other.

As shown in FIG. 2B, the light emitting element 20 is located on the first wiring portions 12. It is sufficient that the light emitting device includes at least one light emitting element 20. The light emitting element 20 includes a mounting surface facing the substrate 10 and a light extraction surface 201 positioned opposite to the mounting surface. The light emitting element 20 includes at least a semiconductor stack body 23, and electrodes 21 and 22 are provided on the semiconductor stack body 23. The light emitting element 20 includes an element substrate 24 in this embodiment, but does not need include the element substrate 24.

The light emitting element 20 may be flip-chip-mounted on the substrate 10. In the case where the light emitting element 20 is flip-chip-mounted on the substrate 10, the electrodes 21 and 22 of the light emitting element 20 are electrically connected with the first wiring portions 12 via a conductive bonding members 60. This makes it unnecessary to provide a wire that supplies electricity to the electrodes 21 and 22 of the light emitting element 20, and thus can reduce the size of the light emitting device. In the case where the light emitting element 20 is flip-chip-mounted, a surface opposite to an electrodes formation surface 203, on which the electrodes 21 and 22 of the light emitting element 20 are positioned, serves as the light extraction surface 201.

Figure 5:
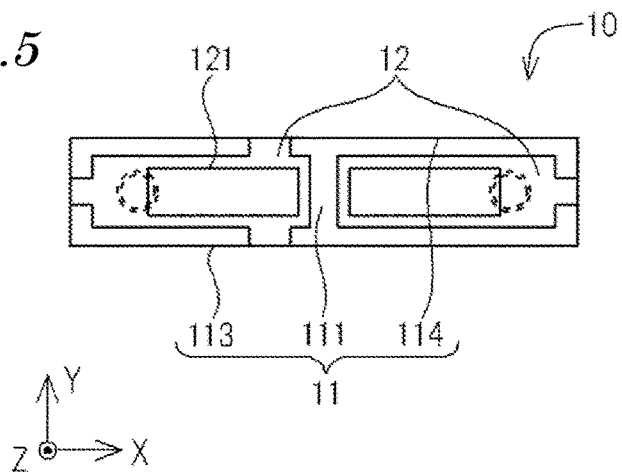
FIG. 5 is a schematic front view of a substrate according to the first embodiment.

In the case where the light emitting element 20 is flip-chip-mounted on the substrate 10, it is preferable that as shown in FIG. 2B and FIG. 5, each of the first wiring portions 12 includes protrusions 121. As seen in a plan view, the protrusions 121 of the first wiring portions 12 are at positions overlapping the electrodes 21 or 22 of the light emitting element 20. With such a structure, in the case where the conductive bonding member 60 is formed of a meltable adhesive, during a process of connecting the protrusions 121 of the first wiring portions 12 and the electrodes 21 and 22 of the light emitting element 20 to each other respectively, the light emitting element 20 and the substrate 10 are easily aligned to each other by a self-alignment effect.

Alternatively, the light emitting element 20 may be located such that the surface thereof opposite to the electrodes formation surface, on which the electrodes 21 and 22 are positioned, faces the substrate 10. In this case, the electrodes formation surface serves as the light extraction surface. With such a configuration, the light emitting device may include wires that electrically connects the electrodes 21 and 22 of the light emitting element 20 and the first wiring portions 12 to each other in order to supply electricity to the light emitting element 20.

As shown in FIG. 2B, the light emitting device 1000 may include a reflective member 40 covering lateral surfaces 202 of the light emitting element 20 and the front surface 111 of the base member 11. With the structure in which the lateral surfaces 202 of the light emitting element 20 are covered with the reflective member 40, the contrast between a light emitting region and a non-light emitting region is improved. Therefore, the light emitting device 1000 can have a highly clear border between the light emitting region and the non-light emitting region.

The reflective member 40 may be formed of, for example, a member containing a white pigment in a base material thereof. It is preferable that the base material of the reflective member 40 is formed of a resin, for example, a silicone resin, an epoxy resin, a phenol resin, a polycarbonate resin, an acrylic resin or a modified resin thereof. It is especially preferable to use a silicone resin, which is highly resistant against heat and light, as the base material of the reflective member 40. An epoxy resin, which is harder than the silicone resin, may be used as the base material of the reflective member 40. This can increase the strength of the light emitting device 1000.

The white pigment of the reflective member 40 may be formed of a single material or a combination of two or more materials among, for example, titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, and the like. The white pigment may have an appropriately selected shape, and may be irregular or crushed. It is preferable that the white pigment is spherical from the point of view of the fluidity. It is preferable that the white pigment has an average particle diameter of, for example, about 0.1 µm or longer and about 0.5 µm or shorter. It is preferable that the particle diameter of the white pigment is as short as possible in order to improve the light reflectance and the effect of covering. The content of the white pigment in the reflective member 40 may be appropriately selected, and is, for example, preferably 10 wt. % or higher and 80 wt. % or lower, more preferably 20 wt. % or higher and 70 wt. % or lower, and still more preferably 30 wt. % or higher and 60 wt. % or lower, from the points of view of the light reflectance, the viscosity in a liquid state and the like. The term "wt. %" herein refers to percent by weight, and represents the ratio of a weight of a material of interest with respect to the total weight of the reflective member 40.

Figure 6:
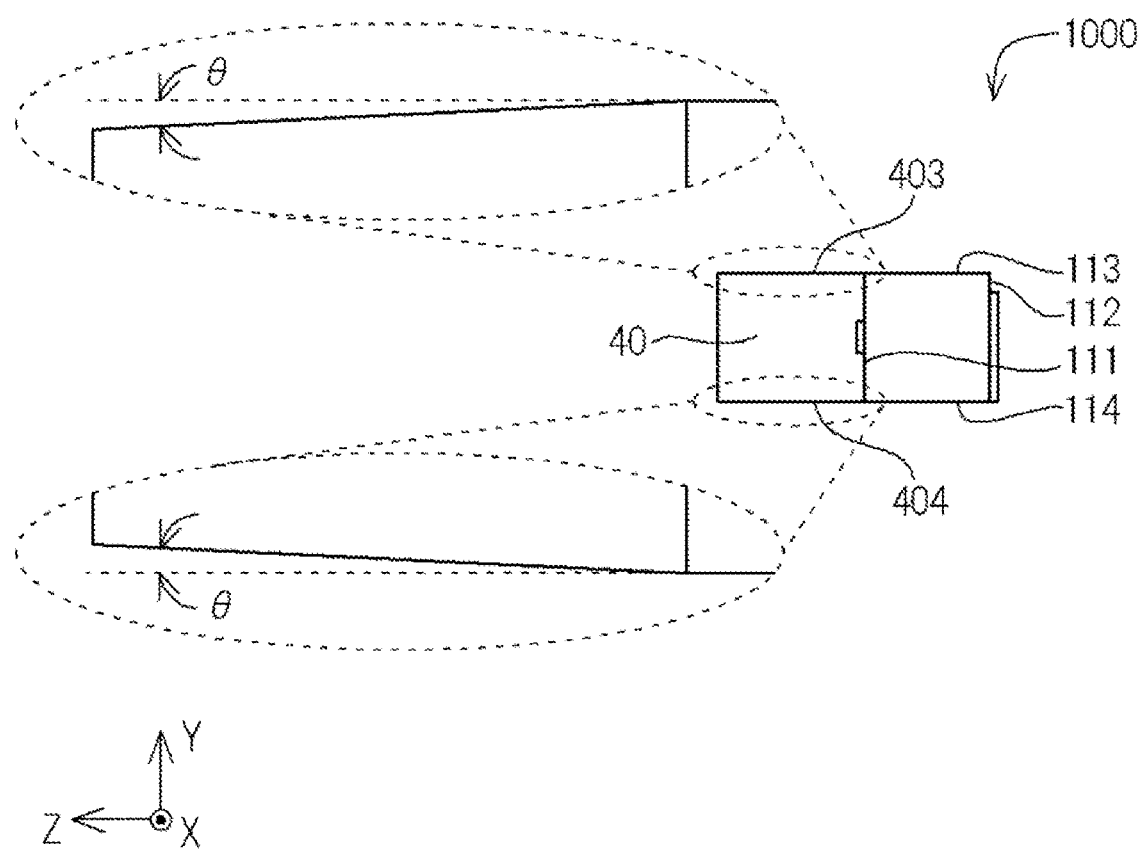
FIG. 6 is a schematic side view of the light emitting device according to the first embodiment.

As shown in FIG. 6, the reflective member 40 has longer lateral surfaces 403 and 404 extending in the longitudinal direction respectively on the top surface 113 side and the bottom surface 114 side of the base member 11. It is preferred that the longer lateral surface 404 of the reflective member 40 is inclined inward in the light emitting device 1000 along the Z direction. With such a structure, in the step of mounting the light emitting device 1000 on the support substrate, contact of the lateral surface 404 of the reflective member 40 to the support substrate is alleviated. Therefore, the mounting orientation of the light emitting device 1000 is easily stabilized while being mounted. It is preferred that the longer lateral surface 403 of the reflective member 40 is inclined inward in the light emitting device 1000 along the Z direction. Such a structure can alleviate the lateral surface 403 of the reflective member 40 to be in contact with a suction nozzle (also referred to as collet), thereby reducing a possibility that the reflective member 40 is damaged at the time of suction of the light-emitting device 1000. As can be seen, it is preferred that the longer lateral surface 404 of the reflective member 40 on the bottom surface 114 side, and the longer lateral surface 403 of the reflective member 40 on the top surface 113 side, are inclined inward in the light emitting device 1000 along the Z direction. The inclination angle θ of the reflective member 40 may be appropriately selected. From the points of view of ease of providing the above-described effects and of the strength of the reflective member 40, the inclination angle θ is preferably 0.3° or larger and 3° or smaller, is more preferably 0.5° or larger and 2° or smaller, and is still more preferably 0.7° or larger and 1.5° or smaller.

As shown in FIG. 2B, the light emitting device 1000 may include a light-transmissive member 30. It is preferable that the light-transmissive member 30 is positioned on or above the light emitting element 20. Positioning the light-transmissive member 30 on the light emitting element 20 can protect the light emitting element 20 against an external stress. It is preferable that the reflective member 40 covers lateral surfaces of the light-transmissive member 30. Such a structure can improve the contrast between a light emitting region and a non-light emitting region. Therefore, the light emitting device 1000 can have a highly clear border between the light emitting region and the non-light emitting region.

The light-transmissive member 30 may be in contact with the light extraction surface 201 or, or as shown in FIG. 2B, may cover the light extraction surface 201 via a light guide member 50. The light guide member 50 may be positioned only between the light extraction surface 201 of the light emitting element 20 and the light-transmissive member 30 to secure the light emitting element 20 and the light-transmissive member 30, or may cover the light extraction surface 201 of the light emitting element 20 and also the lateral surfaces 202 of the light emitting element 20 to secure the light emitting element 20 and the light-transmissive member 30. The light guide member 50 may have a higher transmittance to light from the light emitting element 20 than a transmittance of the reflective member 40. Therefore, with the structure in which the light guide member 50 covers the lateral surfaces 202 of the light emitting element 20 as well as the light extraction surface 201, light emitted from the lateral surfaces 202 of the light emitting element 20 is easily extracted to the outside of the light emitting device 1000 via the light guide member 50. This can improve the light extraction efficiency.

The light-transmissive member 30 may contain wavelength conversion particles. This allows color adjustment of the light emitting device 1000 to be performed easily. The wavelength conversion particles absorb at least a part of primary light emitted by the light emitting element 20 and emit secondary light having a wavelength different from that of the primary light. With the structure in which the light-transmissive member 30 contains the wavelength conversion particles, the light emitting device 1000 can emit mixed color light, which is a mixture of a color of the primary light emitted by the light emitting element 20 and a color of the secondary light emitted by the wavelength conversion particles. For example, a blue LED may be used for the light emitting element 20, and a phosphor such as YAG or the like may be used for the wavelength conversion particles. In this case, the light emitting device 1000 can output white light obtained as a result of light mixture which comprises blue light from the blue LED and yellow light emitted by the phosphor excited by the blue light. Alternatively, a blue LED may be used for the light emitting element 20, and a β-SiAlON-based phosphor, which is a green phosphor, and a manganese-activated fluoride-based phosphor, which is a red phosphor, may be used for the wavelength conversion particles. In this case, the light emitting device 1000 can output white light.

The wavelength conversion particles may be dispersed uniformly in the light-transmissive member 30, or may be locally positioned closer to the light emitting element 20 than to a top surface of the light-transmissive member 30. In the case where the wavelength conversion particles are locally positioned closer to the light emitting element 20 than to the top surface of the light-transmissive member 30, even if the wavelength conversion particles, which are weak against moisture, are used, a base material of the light-transmissive member 30 serves as a protective layer. This can alleviate deterioration of the wavelength conversion particles. Examples of the material of the wavelength conversion particles weak against moisture include a manganese-activated fluoride-based phosphor. The manganese-activated fluoride-based phosphor emits light having a relatively narrow spectral band width, which is preferable from the point of view of color reproducibility.

Alternatively, as shown in FIG. 2B, the light-transmissive member 30 may include layers 31 and 32 containing the wavelength conversion particles (i.e., a first wavelength conversion layer 31 and a second wavelength conversion layer 32) and a layer 33 containing substantially no wavelength conversion particles. The layer 33 containing substantially no wavelength conversion particles is positioned at an upper side than the layers 31 and 32 containing the wavelength conversion particles. With such a structure, the layer 33 containing substantially no wavelength conversion particles can serve as a protective layer, and thus can alleviate deterioration of the wavelength conversion particles. The expression "contains substantially no wavelength conversion particles" indicates that unavoidable contamination with the wavelength conversion particles is not eliminated. It is preferable that the light-transmissive layer 30 has a content of the wavelength conversion particles of 0.05% by weight or lower.

The layers 31 and 32 containing the wavelength conversion particles may be formed of a single layer or a plurality of layers. For example, as shown in FIG. 2B, the light-transmissive layer 30 may include the first wavelength conversion layer 31 and the second wavelength conversion layer 32 covering the first wavelength conversion layer 31. The first wavelength conversion layer 31 is located closer to the light extraction surface 201 of the light emitting element 20 than the second wavelength conversion layer 32. The second wavelength conversion layer 32 may directly cover the first wavelength conversion layer 31, or may cover the first wavelength conversion layer 31 through another light-transmissive layer.

It is preferable that the wavelength conversion particles contained in the first wavelength conversion layer 31 emit light having an emission peak wavelength shorter than an emission peak wavelength of light emitted by the wavelength conversion particles contained in the second wavelength conversion layer 32. With such an arrangement, the wavelength conversion particles contained in the second wavelength conversion layer 32 can be excited by the light from the first wavelength conversion layer 31, which is excited by the light emitting element 20. This can increase the amount of light from the wavelength conversion particles in the second wavelength conversion layer 52.

The emission peak wavelength of the light emitted by the wavelength conversion particles contained in the first wavelength conversion layer 31 is preferably 500 nm or longer and 570 nm or shorter. The emission peak wavelength of the light emitted by the wavelength conversion particles contained in the second wavelength conversion layer 32 is preferably 610 nm or longer and 750 nm or shorter. With such an arrangement, the light emitting device 1000 can have a high color reproducibility. For example, the wavelength conversion particles contained in the first wavelength conversion layer 31 may be formed of a β-SiAlON-based phosphor, and the wavelength conversion particles contained in the second wavelength conversion layer 32 may be formed of a phosphor of manganese-activated potassium fluorosilicate. In the case where the wavelength conversion particles contained in the second wavelength conversion layer 32 is formed of a phosphor of manganese-activated potassium fluorosilicate, it is especially preferable that the light-transmissive member 30 includes the first wavelength conversion layer 31 and the second wavelength conversion layer 32. The phosphor of manganese-activated potassium fluorosilicate is likely to reach luminance saturation. However, the first wavelength conversion layer 31 positioned between the second wavelength conversion layer 32 and the light emitting element 20 can alleviate the phosphor of manganese-activated potassium fluorosilicate to be excessively irradiated with the light from the light emitting element 20. This can alleviate deterioration of the phosphor of manganese-activated potassium fluorosilicate.

The light-transmissive member 30 may include first wavelength conversion particles that absorb at least a part of primary light emitted by the light emitting element 20 and emit secondary light by forbidden transition, and second wavelength conversion particles that absorb at least a part of primary light emitted by the light emitting element 20 and emit the secondary light by allowed transition. In general, the first wavelength conversion particles that emit the secondary light by forbidden transition has a longer afterglow time than that of the second wavelength conversion particles that emit the secondary light by allowed transition. Therefore, in the case where the light-transmissive member 30 contains both of the first wavelength conversion particles and the second wavelength conversion particles, the afterglow time can be shorter than in the case where the light-transmissive member 30 contains only the first wavelength conversion particles. The first wavelength conversion particles may be formed of, for example, a phosphor of manganese-activated potassium fluorosilicate (e.g., $K_2SiF_6$:Mn), and the second wavelength conversion particles may be formed of, for example, a CASN-based phosphor. In the case where the light-transmissive member 30 contains a CASN-based phosphor and a phosphor of manganese-activated potassium fluorosilicate, the afterglow time can be shorter than in the case where the light-transmissive member 30 contains only a phosphor of manganese-activated potassium fluorosilicate. In general, a phosphor of manganese-activated potassium fluorosilicate emits light having an emission peak having a narrower half width than that of light emitted by a CASN-based phosphor, and thus provides a light emitting device with a higher color purity and a higher color reproducibility. Therefore, in the case where the light-transmissive member 30 contains a CASN-based phosphor and a phosphor of manganese-activated potassium fluorosilicate, the color reproducibility is higher than in the case where the light-transmissive member 30 contains only a CASN-based phosphor.

For example, the weight of the phosphor of manganese-activated potassium fluorosilicate contained in the light-transmissive member 30 is preferably at least 0.5 times and at most 6 times the weight of the CASN-based phosphor, is more preferably at least equal to, and at most 5 times the weight of the CASN-based phosphor, and is still more preferably at least twice and at most 4 times the weight of the CASN-based phosphor. Increasing the weight of the phosphor of manganese-activated potassium fluorosilicate improves the color reproducibility of the light emitting device 1000. Increasing the weight of the CASN-based phosphor can shorten the afterglow time.

It is preferable that the phosphor of manganese-activated potassium fluorosilicate has an average particle diameter of 5 μm or longer and 30 μm or shorter. It is preferable that the CASN-based phosphor has an average particle diameter of 5 μm or longer and 30 μm or shorter. With the structure in which the phosphor of manganese-activated potassium fluorosilicate and/or the CASN-based phosphor has an average particle diameter of 30 μm or shorter, light from the light emitting element 20 is easily diffused by the wavelength conversion particles. This can alleviate the color non-uniformity of distributed light of the light emitting device 1000. With the structure in which the phosphor of manganese-activated potassium fluorosilicate and/or the CASN-based phosphor has an average particle diameter of 5 μm or longer, the light is easily extracted from the light emitting element 20. This improves the light extraction efficiency of the light emitting device 1000.

The CASN-based phosphor and the phosphor of manganese-activated potassium fluorosilicate may be contained in the same wavelength conversion layer of the light-transmissive member 30. In the case where the light-transmissive member 30 includes a plurality of wavelength conversion layers, the CASN-based phosphor and the phosphor of manganese-activated potassium fluorosilicate may respectively be contained in different wavelength conversion layers. In the case where the phosphor of manganese-activated potassium fluorosilicate and the CASN-based phosphor are respectively contained in different wavelength conversion layers, it is preferable that the wavelength conversion particles formed of the phosphor of manganese-activated potassium fluorosilicate or the wavelength conversion particles formed of the CASN-based phosphor that emit light having a shorter emission peak wavelength are positioned closer to the light emitting element 20. With such an arrangement, the wavelength conversion particles emitting light having a longer emission peak wavelength can be excited by light from the wavelength conversion particles having a shorter emission peak wavelength. For example, the emission peak wavelength of light emitted by the phosphor of manganese-activated potassium fluorosilicate may be around 631 nm, and the emission peak wavelength of light emitted by the CASN-based phosphor may be around 650 nm. In this case, it is preferable that the wavelength conversion particles formed of the phosphor of manganese-activated potassium fluorosilicate are positioned closer to the light emitting element 20.

The second wavelength conversion particles may alternatively be formed of a SCASN-based phosphor, a SLAN phosphor (e.g., $SrLiAl_3N_4$: Eu) or the like. For example, the light-transmissive member 30 may contain a SLAN-based phosphor and a phosphor of manganese-activated potassium fluorosilicate. Alternatively, the light-transmissive member 30 may contain the first wavelength conversion particles formed of a red phosphor, and the second wavelength conversion particles formed of a β-SiAlON-based phosphor, which is a green phosphor. Such an arrangement improves the color reproducibility of the light emitting device 1000.

Step of Preparing a Support Substrate

Figure 7A:
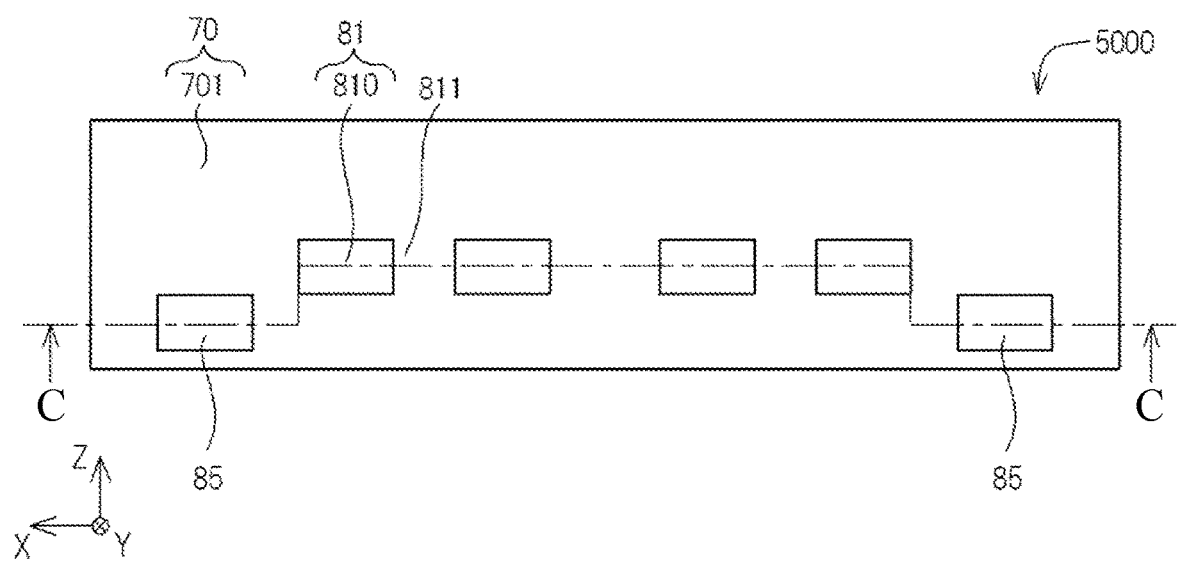
FIG. 7A is a schematic plan view of a support substrate according to the first embodiment.
Figure 7B:
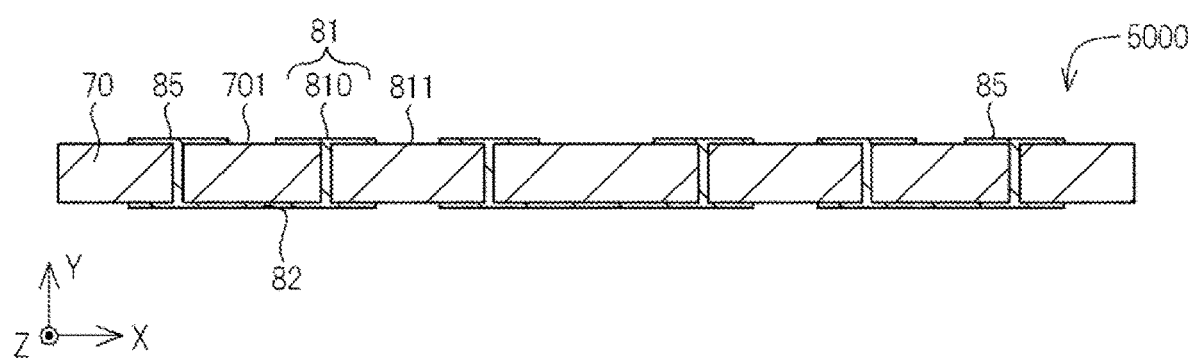
FIG. 7B is a schematic cross-sectional view taken along line C-C in FIG. 7A.

As shown in FIG. 7A and FIG. 7B, a support substrate 5000 is provided which includes a support base member 70, first wiring patterns 81 each including a joining region 810 provided on a top surface 701 of the support base member 70, and an insulating region 811 enclosing the joining regions 810. The support base member 70 is an insulating member. The joining region 810 of the support substrate 5000 is a part of each wiring pattern 81 and is to be joined with the second wiring portion 13 of the light emitting device 1000 by the solder member. The support base member 70 and the first wiring patterns 81 may be formed of a known material.

In the case where the top surface 701 of the support base member 70 is exposed to the outside as shown in FIG. 7A, the support base member 70 includes the insulating region 811 enclosing the joining regions 810, on the top surface 701. With the structure in which the joining regions 810 are enclosed by the insulating region 811, wetting of melted solder is easily controlled. In general, melted solder spreads more easily on a wiring pattern (e.g., the first wiring pattern 81) than on an insulative support (e.g., the support base member 70) on which the wiring pattern is provided. This improves the self-alignment effect and thus improves the ease of mounting of the light emitting device 1000.

As shown in FIG. 7B, the support substrate 5000 may include second wiring patterns 82 positioned on a bottom surface opposite to the top surface 701 of the support base member 70. The first wiring patterns 81 positioned on the top surface 701 of the support base member 70 and the second wiring patterns 82 positioned on the bottom surface of the support base member 70 may be electrically connected to each other by one or more vias respectively. In the case where the support substrate 5000 includes an electric power supply 85 on a top surface thereof, the electric power supply 85 and the second wiring patterns 82 may be electrically connected to each other by the vias.

Figure 8A:
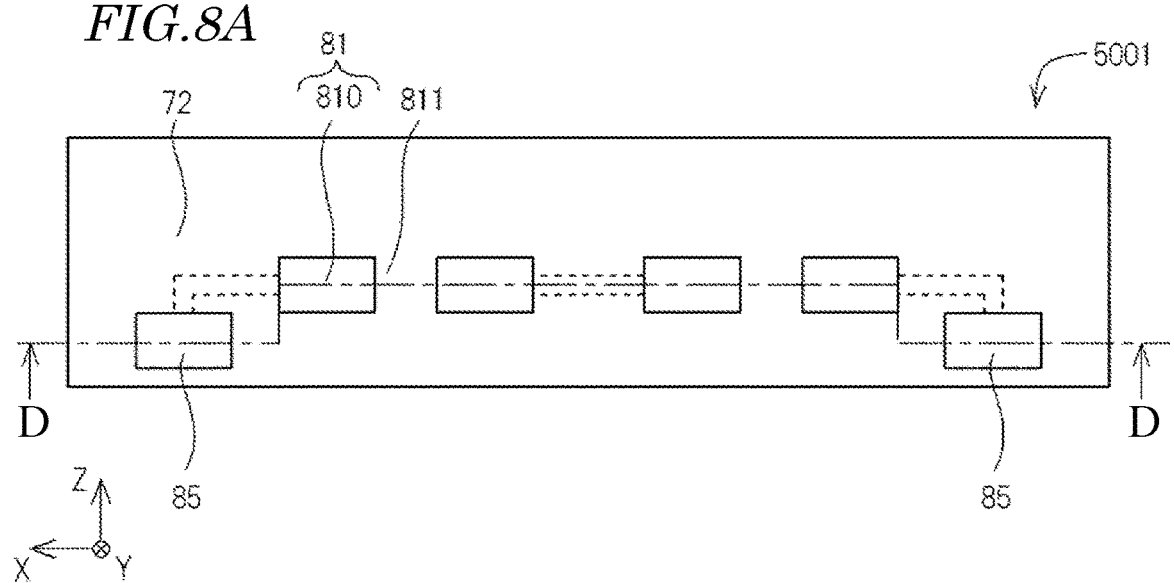
FIG. 8A is a schematic plan view of a modification of the support substrate according to the first embodiment.
Figure 8B:
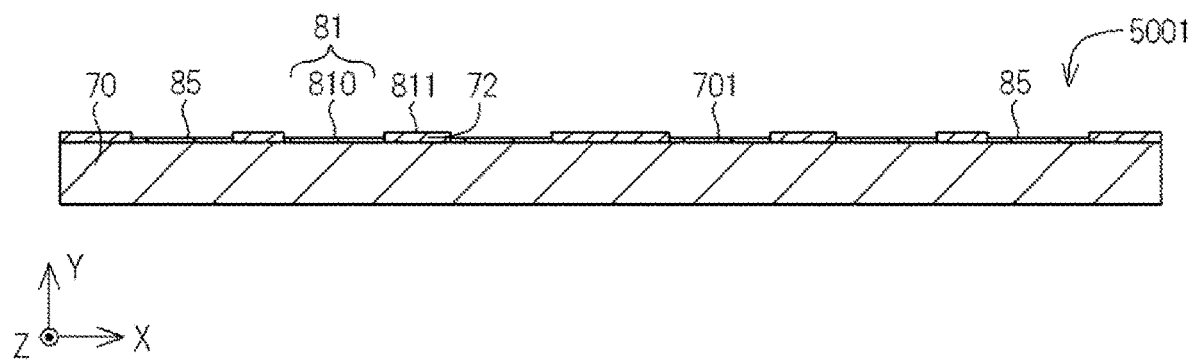
FIG. 8B is a schematic cross-sectional view taken along line D-D in FIG. 8A.

As shown in FIG. 8A and FIG. 8B, the support substrate may include an insulating layer. A support substrate 5001 illustrated in FIG. 8A and FIG. 8B includes an insulating layer 72 covering the top surface 701 of the support base member 70 and the first wiring patterns 81. In the case where the insulating layer 72 encloses the joining regions 810 of the first wiring patterns 81, the insulating region 811 consists in a whole or a part of the insulating layer 72. In general, melted solder spreads more easily on a wiring pattern (e.g., the first wiring pattern 81) than on an insulation surface (e.g., the insulating layer 72). In the case where the joining regions 810 of the first wiring patterns 81 are enclosed by the support base member 70 and the insulating layer 72, the insulating region 811 may include a part of the support base member 70 and the insulating layer 72.

Figure 9A:
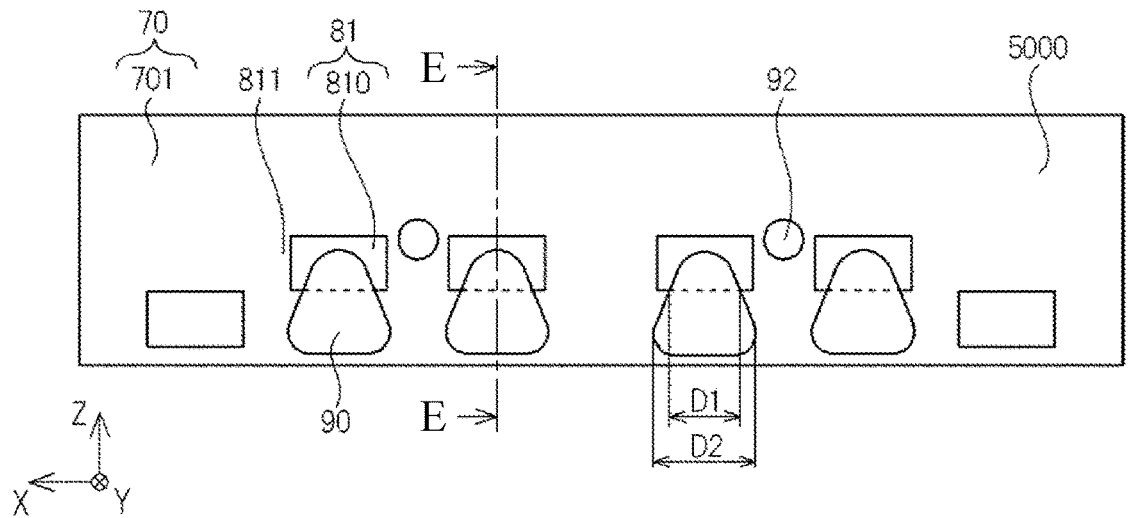
FIG. 9A is a schematic plan view showing a method of producing a light source device according to the first embodiment.
Figure 9B:
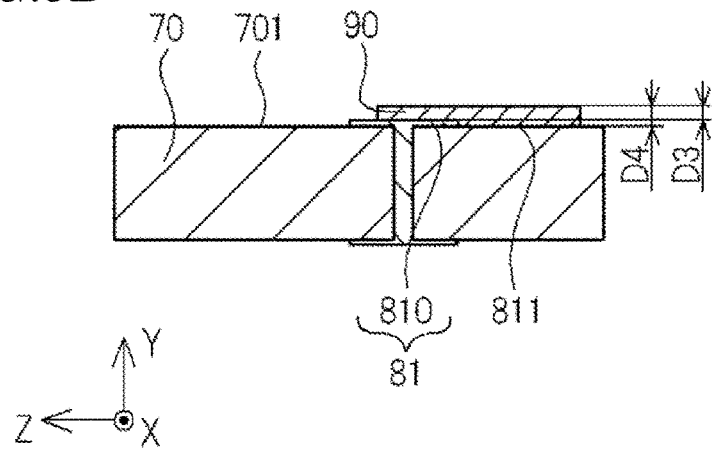
FIG. 9B is a schematic cross-sectional view taken along line E-E in FIG. 9A.

Step of Locating a Solder Member Astride the Joining Region and the Insulating Region As shown in FIG. 9A and FIG. 9B, solder members 90 are applied on the joining regions 810 and the insulating region 811 such that a portion of each of the solder members 90 positioned on the insulating region 811 has a volume larger than a volume of a portion of the solder member 90 positioned on the corresponding joining region 810. Hereinafter, the description may be made on one solder member 90 and one joining region 810.

Such a structure can decrease the volume of the portion of the solder member 90 positioned on the joining region 810. This can reduce a possibility that melted solder enters a space between the bottom surface 114 of the base member 11 and the top surface of the support substrate, in the step of joining the light emitting device and the support substrate to each other by the solder member 90 as described below. Therefore, when the light emitting device (e.g., the light emitting device 1000) and the support substrate (e.g., the support substrate 5000), are joined to each other, formation of the heated and melted solder between the bottom surface 114 of the base member 11 and the top surface of the support substrate can be alleviated. This can alleviate the light emitting device to be inclined with respect to the support substrate.

As shown in FIG. 9A, it is preferable that as seen in a plan view, maximum width D2 of the portion of the solder member 90 positioned on the insulating region 811 is wider than maximum width D1 of the portion of the solder member 90 positioned on the joining region 810. This allows the volume of the portion of the solder member 90 positioned on the insulating region 811 to be larger than the volume of the portion of the solder member 90 positioned on the joining region 810. In this specification, the "maximum width" of the solder member 90 is the maximum value of the width of the solder member 90 in the X direction.

As shown in FIG. 9B, as seen in a cross-sectional view, a top surface of the portion of the solder member 90 positioned on the insulating region 811 and a top surface of the portion of the solder member 90 positioned on the joining region 810 may be flush with each other. For example, a mask made of metal with an opening may be provided on the support substrate 5000 and the solder member 90 may be formed in the opening of the metal mask by screen printing. In this manner, the top surface of the portion of the solder member 90 positioned on the insulating region 811 and the top surface of the portion of the solder member 90 positioned on the joining region 810 can be flush with each other. In this specification, the terms "flush" allows a tolerance of about ±5 μm.

Figure 9C:
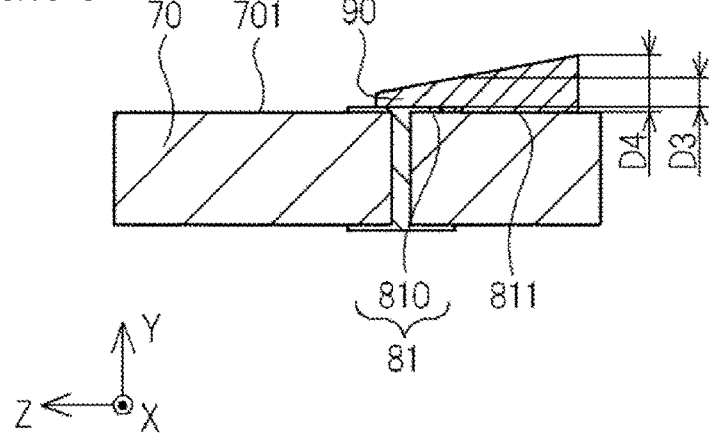
FIG. 9C is a schematic cross-sectional view showing a method of producing a modification of the light source device according to the first embodiment.

As seen in a cross-sectional view, the portion of the solder member 90 positioned on the insulating region 811 may have a maximum thickness equal to a maximum thickness of the portion of the solder member 90 positioned on the joining region 810. Alternatively, as seen in a cross-sectional view, the maximum thickness of the portion of the solder member 90 positioned on the insulating region 811 may be less than the maximum thickness of the portion of the solder member 90 positioned on the joining region 810. As shown in FIG. 9B or FIG. 9C, as seen in a cross-sectional view, maximum thickness D4 of the portion of the solder member 90 positioned on the insulating region 811 may be greater than maximum thickness D3 of the portion of the solder member 90 positioned on the joining region 810. In the case where the maximum thickness D4 of the portion of the solder member 90 positioned on the insulating region 811 is greater than the maximum thickness D3 of the portion of the solder member 90 positioned on the joining region 810 as seen in a cross-sectional view, the volume of the portion of the solder member 90 positioned on the insulating region 811 may be easily made larger than the volume of the portion of the solder member 90 positioned on the joining region 810. For example, even if the surface area size of the portion of the solder member 90 positioned on the insulating region 811 is smaller than the surface area size of the portion of the solder member 90 positioned on the joining region 810 as seen in a plan view, as long as the maximum thickness of the portion of the solder member 90 positioned on the insulating region 811 is greater than the maximum thickness of the portion of the solder member 90 positioned on the joining region 810 as seen in a cross-sectional view, the volume of the portion of the solder member 90 positioned on the insulating region 811 can be made larger than the volume of the portion of the solder member 90 positioned on the joining region 810. In this specification, the "maximum thickness of the solder member 90" refers to the maximum value of the thickness of the solder member 90 in the Y direction.

As shown in FIG. 9A, an uncured adhesive resin member (adhesive resin) 92 may be applied on the support substrate 5000. The adhesive resin member 92 is usable as a member that bonds the light emitting device 1000 and the support substrate 5000 to each other. The provision of the adhesive resin member 92 can increase the joining strength between the light emitting device 1000 and the support substrate 5000. The adhesive resin member 92 has a thickness in the Y direction that is greater than a distance from the bottom surface 114 of the base member 11 and the top surface 701 of the support base member 70 in a state where the light emitting device 1000 is placed on the support substrate 5000. With such an arrangement, the adhesive resin member 92 on the support substrate 5000 can contact to the light emitting device 1000 when the light emitting device 1000 is placed on the support substrate 5000 as described below.

The adhesive resin member 92 may be formed of a known resin such as, for example, a thermosetting resin and/or a thermoplastic resin. A thermosetting resin such as an epoxy resin, a silicone resin or the like is highly resistant against heat and light, and thus is advantageously usable for the adhesive resin member.

The adhesive resin member 92 may be separate from the joining region 810 or may be in contact with a part of the joining region 810. It is preferable that as seen in a plan view, the adhesive resin member 92 is separate from the joining region 810 because the solder member 90 is formed on the joining region 810. In the case where the adhesive resin member 92 is separate from the joining region 810, in the step of joining the light emitting device 1000 and the support substrate 5000 to each other by the solder member 90, melted solder spreads easily on the joining region 810.

It is preferable as shown in FIG. 9A that the adhesive resin member 92 is positioned between, in the X direction, a pair of the joining regions 810 to be joined with a pair of second wiring portions 13 of one light emitting device 1000. The second wiring portions 13 of the light emitting device 1000 and the joining regions 810 of the support substrate 5000 are joined to each other by the solder member 90. Therefore, the adhesive resin member 92 positioned between the pair of joining regions 810 in the X direction can alleviate concentration of a stress to a part of the base member 11 of the light emitting device 1000.

Figure 9D:
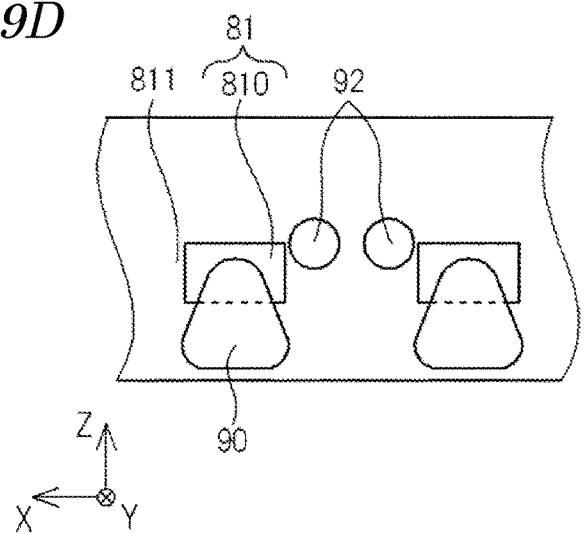
FIG. 9D is a schematic plan view showing a modification of the method of producing the light source device according to the first embodiment.
Figure 9E:
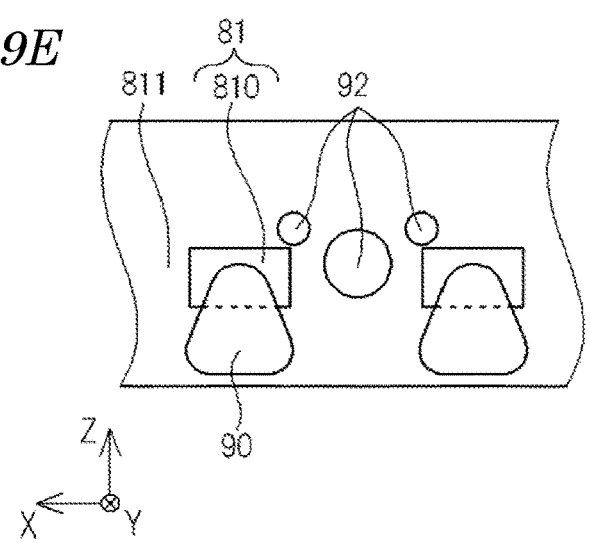
FIG. 9E is a schematic plan view showing another modification of the method of producing the light source device according to the first embodiment.
Figure 9F:
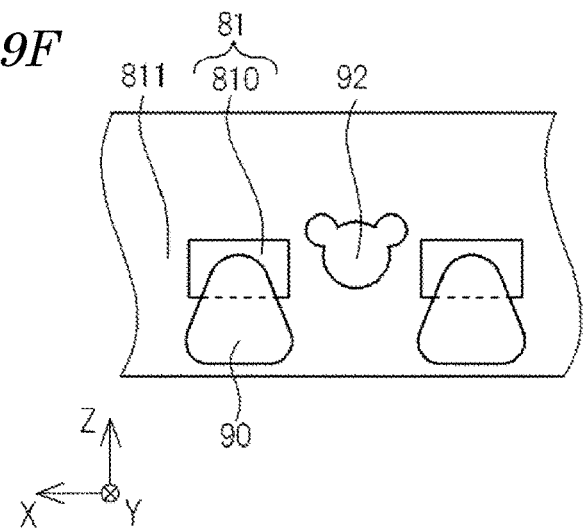
FIG. 9F is a schematic plan view showing still another modification of the method of producing the light source device according to the first embodiment.

Examples of method of applying the uncured adhesive resin member 92 on the support substrate 5000 include application by dispensing or pin transfer, ink-jetting or spraying, and the like. In the case where the adhesive resin member 92 is formed by dispensing or the like, single adhesive resin member 92 may be applied on one portion of the support substrate 5000 as shown in FIG. 9A, or the plurality of adhesive resin members 92 may be applied on a plurality of portions of the support substrate 5000 as shown in FIG. 9D or FIG. 9E. Alternatively, as shown in FIG. 9F, the plurality of the adhesive resin members 92 applied on the plurality of portions of the support substrate 5000 may be connected to each other. In the case where the plurality of the adhesive resin members 92 are applied on the support substrate 5000, the adhesive resin members 92 may be arrayed in the Z direction, or as shown in FIG. 9D, the adhesive resin members 92 may be arrayed in the X direction.

Step of Placing the Light Emitting Device on the Support Substrate

Figure 10A:
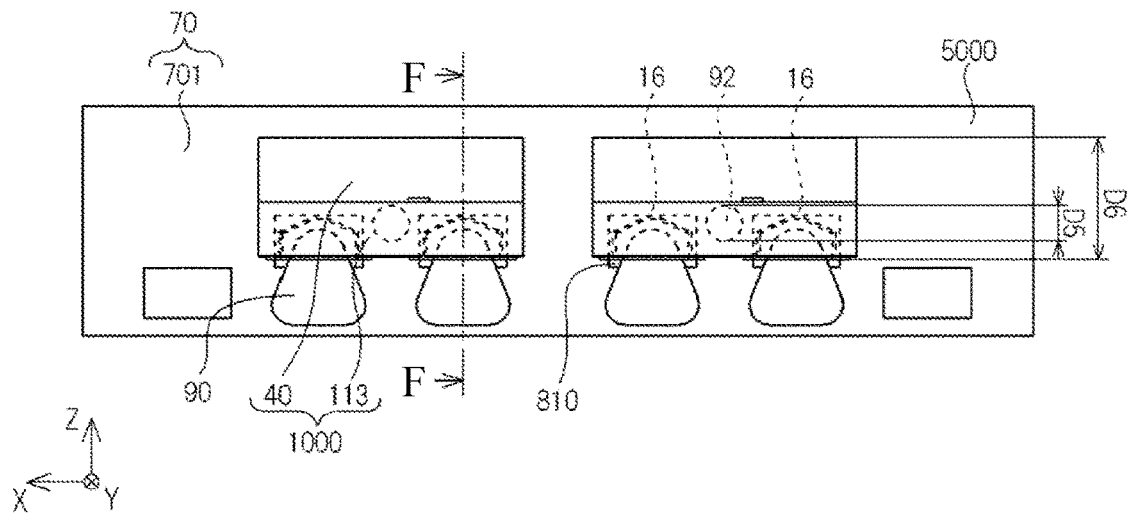
FIG. 10A is a schematic plan view showing the method of producing the light source device according to the first embodiment.
Figure 10B:
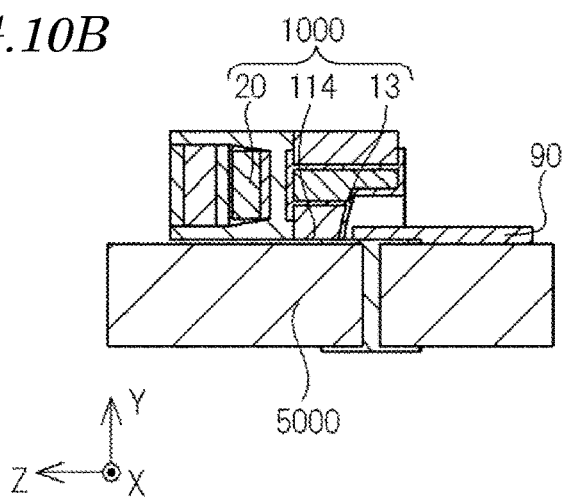
FIG. 10B is a schematic cross-sectional view taken along line F-F in FIG. 10A.

As shown in FIG. 10A and FIG. 10B, the light emitting device 1000 is placed on the support substrate 5000 while each solder member 90 and a portion of the corresponding second wiring portion 13 that is positioned in the vicinity of the bottom surface 114 of the base member 11 are separate from each other as seen in a plan view. In this specification, the "portion of the second wiring portion 13 that is positioned in the vicinity of the bottom surface 114 of the base member 11" indicates a portion of the second wiring portion 13 that is flush with the bottom surface 114 of the base member 11. With the structure in which the light emitting device is placed on the support substrate while the solder member 90 and the portion of the second wiring portion 13 positioned in the vicinity of the bottom surface 114 of the base member 11 are separate from each other, in the step of joining the light emitting device and the support substrate to each other by the solder member 90, entrance of melted solder into a space between the bottom surface 114 of the base member 11 and the top surface of the support substrate can be alleviated. This can alleviate formation of the heated and the melted solder between the bottom surface 114 of the base member 11 and the top surface of the support substrate in the state where the light emitting device and the support substrate are joined to each other as described below. Therefore, the light emitting device can be alleviated to be inclined with respect to the support substrate. In the step of placing the light emitting device on the support substrate while the solder member 90 and the portion of the second wiring portion 13 positioned in the vicinity of the bottom surface 114 of the base member 11 are separate from each other, pre-heating and pre-melting solder is not positioned between the bottom surface 114 of the base member 11 and the top surface of the support substrate.

Figure 10C:
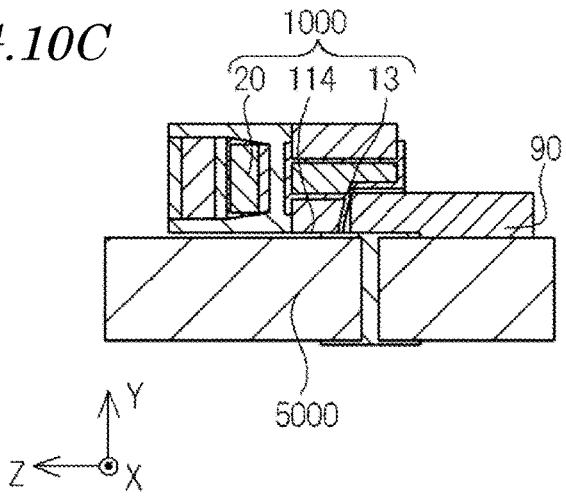
FIG. 10C is a schematic cross-sectional view showing a method of producing a modification of the light source device according to the first embodiment.

As shown in FIG. 10B, the solder member 90 and the second wiring portion 13 may be separate from each other as seen in a cross-sectional view. Alternatively, as shown in FIG. 10C, the solder member 90 and at least a part of a portion of the second wiring portion 13 that is positioned in an area other than the vicinity of the bottom surface 114 of the base member 11 may be in contact with each other as seen in a cross-sectional view. The "portion of the second wiring portion 13 that is positioned in an area other than the vicinity of the bottom surface 114 of the base member 11" refers to a portion of the second wiring portion 13 that is not flush with the bottom surface 114 of the base member 11. Namely, the solder member 90 and at least a part of the portion of the second wiring portion 13 that is not flush with the bottom surface 114 of the base member 11 may be in contact with each other.

In the case where as shown in FIG. 9A, the uncured adhesive resin member 92 is formed on the support substrate 5000, the light emitting device is placed on the support substrate 5000 such that the uncured adhesive resin member 92 and a part of the light emitting device are put into contact with each other. This allows the light emitting device and the support substrate 5000 to be secured to each other also by the cured adhesive resin member. This increases the joining strength between the light emitting device and the support substrate 5000. There is no specific restriction on the position of the adhesive resin member 92. For example, as shown in FIG. 10A, the adhesive resin member 92 may be positioned between the plurality of recessed portions 16 of the base member 11. The second wiring portion 13 located in each of the plurality of recessed portions 16 of the base member 11 is joined to the corresponding joining region 810 of the first wiring pattern 81 of the support substrate 5000 by the solder member 90. Therefore, the adhesive resin member 92 positioned between the plurality of recessed portions 16 of the base member 11 can alleviate application of a stress to the base member 11 of the light emitting device.

It is preferable that as shown in FIG. 10A, the shortest distance between the front surface 111 of the base member 11 and the outer circumference of the adhesive resin member 92 is shorter than the shortest distance between the front surface 111 of the base member 11 and the outer circumference of the solder member 90 as seen in a plan view. Such a structure allows a portion of the base member 11 close to the front surface 111 and the support substrate 5000 to be joined to each other by the adhesive resin member 92, and thus increases the joining strength between the light emitting device and the support substrate 5000. Instead of the support substrate 5000, the uncured adhesive resin member 92 may be applied onto the light emitting device 1000. That is, the light emitting device having the uncured adhesive resin member 92 attached thereto may be placed on the support substrate 5000.

There is no specific restriction on the size of the adhesive resin member 92 as seen in a plan view. It is preferable that as seen in a plan view, maximum width D5 of the adhesive resin member 92 in the Z direction is 0.2 times to 0.7 times maximum width D6 of the light emitting device in the Z direction. With the structure in which as seen in a plan view, the maximum width D5 of the adhesive resin member 92 in the Z direction is at least 0.2 times the maximum width D6 of the light emitting device in the Z direction, thus, the volume of the adhesive resin member 92 is increased. This increases the joining strength between the light emitting device and the support substrate. With the structure in which as seen in a plan view, the maximum width D5 of the adhesive resin member 92 in the Z direction is at most 0.7 times the maximum width D6 of the light emitting device in the Z direction, the adhesive resin member 92 can be less likely to be formed on the joining region 810.

It is preferable that the maximum width of each recessed portion 16 is narrower than the maximum width of the corresponding joining region 810 as seen in a plan view. This makes it easy to increase the surface area size of a portion of the second wiring portion 13 positioned on the joining region 810 as seen in a plan view. The "maximum width of the recessed portion 16" refers to the maximum value of the width of the recessed portion 16 in the X direction, and the "maximum width of the joining region 810" refers to the maximum value of the width of the joining region 810 in the X direction.

Step of Joining the Second Wiring Portion 13 of the Light Emitting Device 1000 and the Joining Region 810 of the Support Substrate 5000

Figure 11:
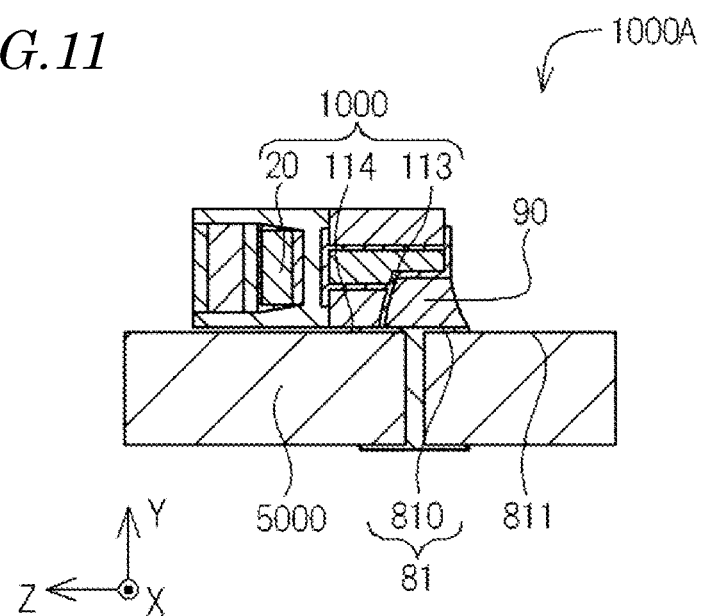
FIG. 11 is a schematic cross-sectional view showing the method of producing the light source device according to the first embodiment.

As shown in FIG. 11, the solder member 90 is melted by heating to join the respective second wiring portion 13 of the light emitting device 1000 and the corresponding one of the joining regions 810 of the support substrate 5000. The melted solder member 90 gathers onto the joining region 810, on which the melted solder member 90 is easily spread. As a result, the volume of a portion of the heated and melted solder member 90 positioned on the joining region 810 can be larger than the volume of a portion of the heated and melted solder member 90 positioned on the insulating region 811. With the structure in which the volume of the portion of the heated and melted solder member 90 positioned on the joining region 810 is larger, the second wiring portion 13 and the joining region 810 are easily joined to each other by the solder member 90. This increases the joining strength between the light emitting device 1000 and the support substrate 5000. Moreover, the heated and melted solder member 90 is less likely to be formed between the bottom surface 114 of the base member 11 and the top surface of the support substrate 5000. Therefore, inclination of the light emitting device 1000 with respect to the support substrate 5000 is alleviated when being joined with the support substrate 5000. As shown in FIG. 11, it is preferable that entire of the heated and melted solder member 90 is positioned on the joining region 810.

In the case where the uncured adhesive resin member 92 is formed on the support substrate 5000, the adhesive resin member 92 may be cured in the step of melting the solder member 90 by heating which is performed to join the second wiring portion 13 of the light emitting device 1000 and the joining region 810 of the support substrate 5000 to each other. This can shorten the time required to produce a light source device.

A light source device 1000A may be produced by performing the above-described steps as described above.

Second Embodiment

A method of producing a light source device according to the second embodiment will be described. The method of producing a light source device according to the second embodiment is substantially the same as the method of producing a light source device according to the first embodiment except for the step of providing the light emitting device.

In the present embodiment, a light emitting device including the substrate and a plurality of light emitting elements is provided. A light emitting device 2000 shown in FIG. 13B includes the substrate 10 and a plurality of light emitting elements. Like in the light emitting device 1000 according to embodiment 1, the substrate 10 includes the base member 11, the first wiring portions 12 and the second wiring portions 13. The light emitting device 1000 according to embodiment 1 includes only one light emitting element, whereas the light emitting device 2000 according to embodiment 2 includes a plurality of light emitting elements, more specifically, a first light emitting element 20A and a second light emitting element 20B. The first light emitting element 20A and/or the second light emitting element 20B may be referred to simply as the "light emitting element".

The first light emitting element 20A and the second light emitting element 20B may emit light having the same emission peak wavelength as each other, or may emit light having different emission peak wavelengths from each other. In the case where, for example, the first light emitting element 20A and the second light emitting element 20B emit light having the same emission peak wavelength as each other, the emission peak wavelength of the light emitted by the first light emitting element 20A and the second light emitting element 20B may be in the range of 430 nm or longer and shorter than 490 nm (i.e., wavelength range of blue light). In this specification, the expression that the "emission peak wavelength is the same" indicates that a tolerance of about ±10 nm is allowed. In the case where the first light emitting element 20A and the second light emitting element 20B emit light having different emission peak wavelengths from each other, the emission peak wavelength of the light emitted by the first light emitting element 20A may be in the range of 430 nm or longer and shorter than 490 nm (i.e., wavelength range of blue light), whereas the emission peak wavelength of the light emitted by the second light emitting element 20B may be in the range of 490 nm or longer and 570 nm or shorter (i.e., wavelength range of green light). With such an arrangement, the light emitting device 2000 can have an improved color reproducibility.

Figure 13A:
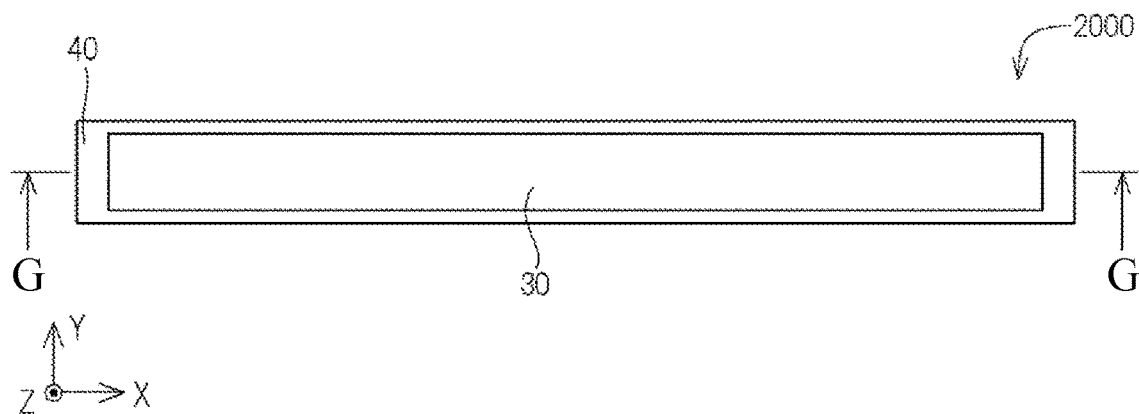
FIG. 13A is a schematic front view of the light emitting device according to the second embodiment.
Figure 13B:
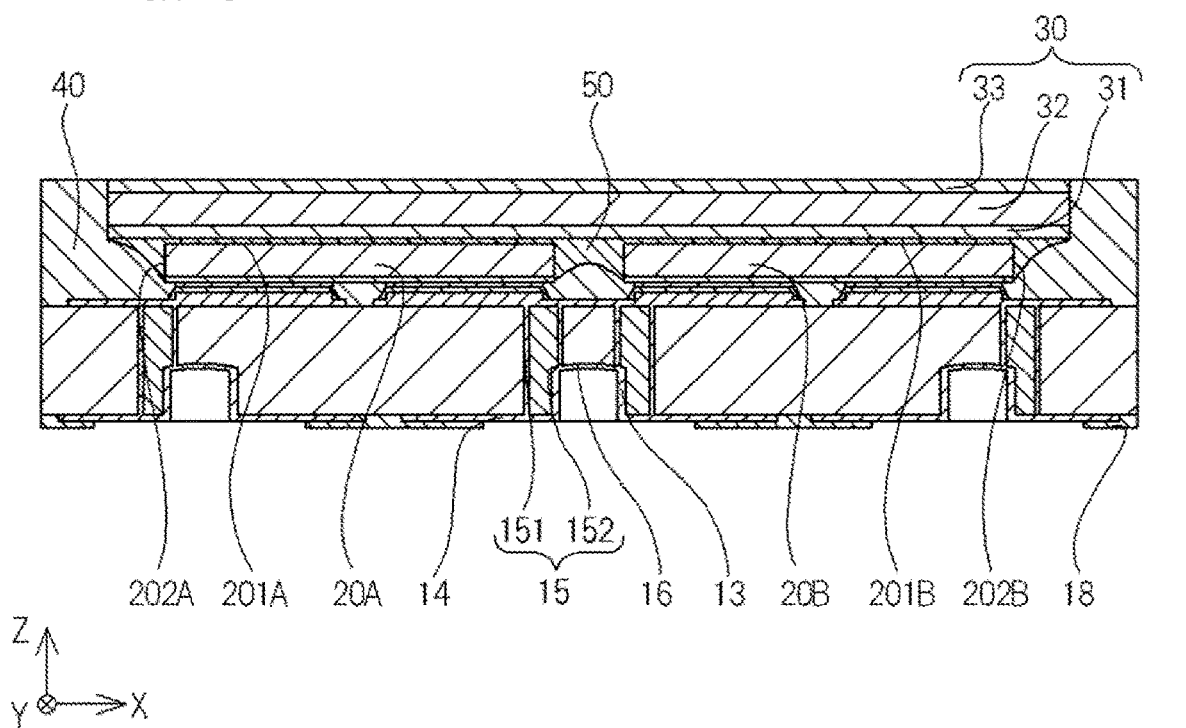
FIG. 13B is a schematic cross-sectional view taken along line G-G in FIG. 13A.

As shown in FIG. 13B, the light emitting device 2000 may include the light-transmissive member 30 covering the first light emitting element 20A and the second light emitting element 20B. With the structure in which the light emitting device 2000 includes the light-transmissive member 30 covering a first light extraction surface 201A of the first light emitting element 20A and a second light extraction surface 201B of the second light emitting element 20B, unevenness in luminance between the first light emitting element 20A and the second light emitting element 20B can be alleviated. In the case where the emission peak wavelength of the light emitted by the first light emitting element 20A and the emission peak wavelength of the light emitted by the second light emitting element 20B are different from each other, the light emitting device 2000 can have an improved color mixing as a result of the light from the first light emitting element 20A and the light from the second light emitting element 20B being guided to the light guide member 50.

In the example shown in FIG. 13B, the light guide member 50 continuously covers first lateral surfaces 202A of the first light emitting element 20A and second lateral surfaces 202B of the second light emitting element 20B. With such a configuration, unevenness in luminance between the first light emitting element 20A and the second light emitting element 20B can be alleviated.

Figure 12A:
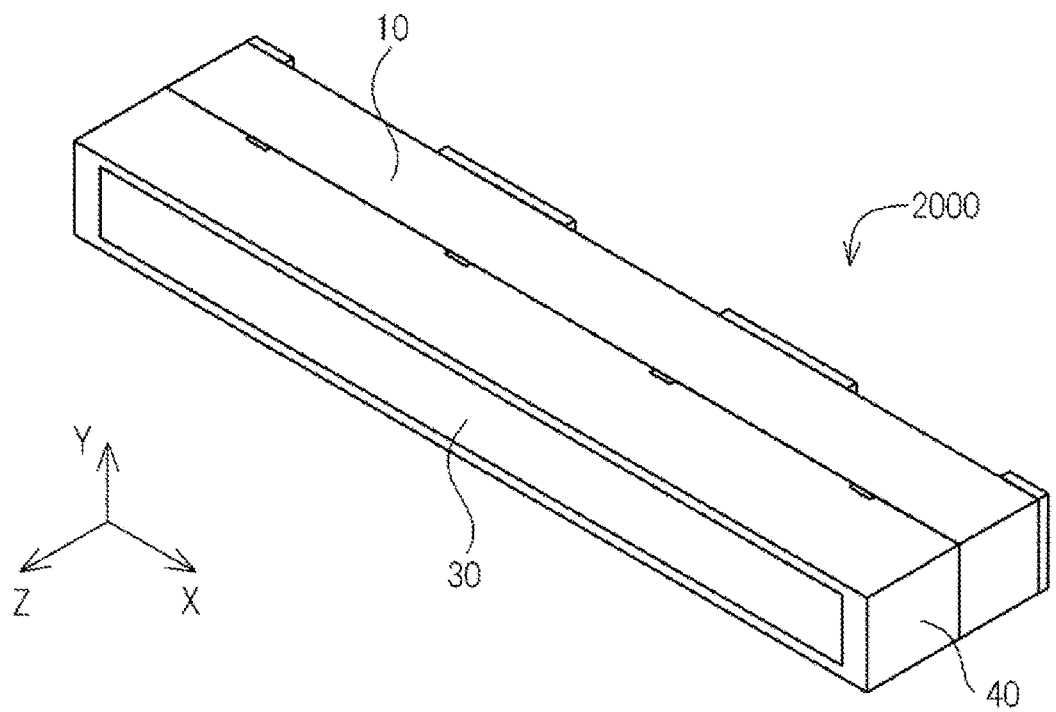
FIG. 12A is a schematic perspective view of a light emitting device according to a second embodiment.
Figure 12B:
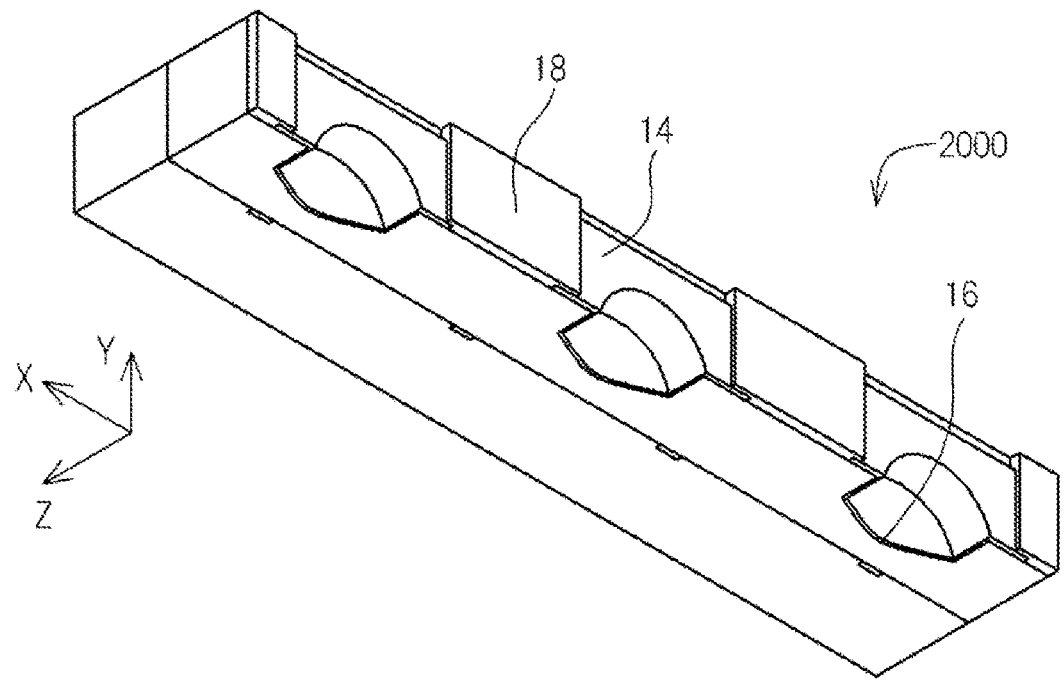
FIG. 12B is another schematic perspective view of the light emitting device according to the second embodiment.

The light emitting device according to certain embodiments of the present disclosure may include an insulating film covering a part of the third wiring portion 14. In the example shown in FIG. 12B and FIG. 13B, the light emitting device 2000 includes an insulating film 18 covering a part of the third wiring portion 14. The provision of the insulating film 18 can ensure that a rear surface 112 of the light emitting device is insulated and reduce a risk of short-circuit of the light emitting device. The provision of the insulating film 18 can also reduce a risk that the third wiring portion 14 is delaminated from the base member 11.

Figure 14:
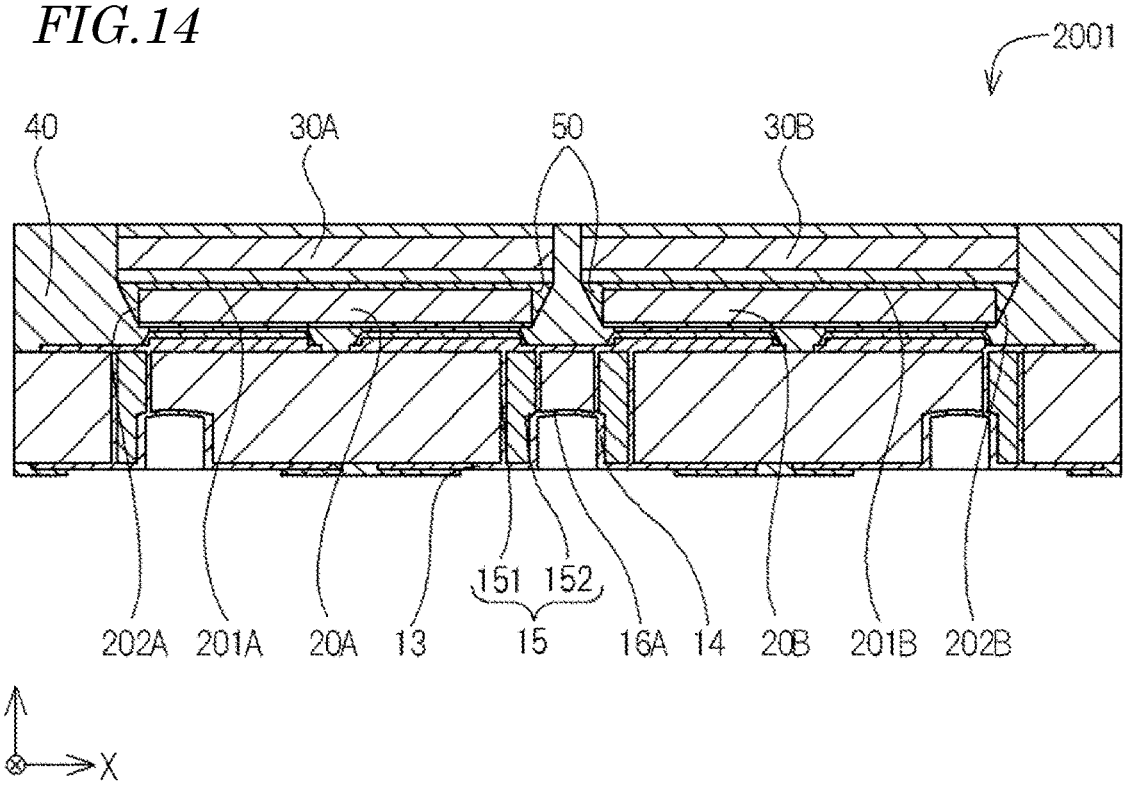
FIG. 14 is a schematic cross-sectional view of a modification of the light emitting device according to the second embodiment.

The light emitting device may include a first light-transmissive member covering the first light emitting element 20A and a second light-transmissive member covering the second light emitting element 20B. In the example shown in FIG. 14, a light emitting device 2001 includes a first light-transmissive member 30A covering the first light emitting element 20A and a second light-transmissive member 30B covering the second light emitting element 20B.

The first light-transmissive member 30A and the second light-transmissive member 30B may contain wavelength conversion particles. The wavelength conversion particles contained in the first light-transmissive member 30A and the wavelength conversion particles contained in the second light-transmissive member 30B may be of the same material or of different materials. In the case where the light emitting device 2000 includes the first light emitting element 20A emitting light having an emission peak wavelength in the range of 430 nm or longer and shorter than 490 nm (i.e., wavelength range of blue light) and the second light emitting element 20B emitting light having an emission peak wavelength in the range of 490 nm or longer and 570 nm or shorter (i.e., wavelength range of green light), the first light-transmissive member 30A may contain the wavelength conversion particles formed of a red phosphor, whereas the second light-transmissive member 30B may contain substantially no wavelength conversion particles. With such an arrangement, the light emitting device 2000 can have an improved color reproducibility. Moreover, light from the second light emitting element 20B is not blocked by the wavelength conversion particles, and therefore, the light extraction efficiency of the light emitting device 2000 can be improved. Examples of the red phosphor usable for the wavelength conversion particles contained in the first light-transmissive member 30A include a manganese-activated fluoride-based phosphor.

Hereinafter, components of a light emitting device according to an embodiment of the present disclosure will be described.

Substrate 10

The substrate 10 is a member on which at least one light emitting element is placed. The substrate 10 includes at least the base member 11, one or more first wiring portions 12 and one or more second wiring portions 13.

Base Member 11

The base member 11 may be formed of an insulating material such as a resin, a fiber-reinforced plastic resin (e.g., glass epoxy resin), a ceramic material, glass or the like. For the resin or a fiber-reinforced resin, epoxy, glass epoxy, bismaleimide triazine (BT), polyimide, or the like can be used. Examples of the ceramic material include aluminum oxide, aluminum nitride, zirconium oxide, zirconium nitride, titanium oxide, titanium nitride, a mixture thereof, and the like. Among these materials, it is preferable to use, especially, a material having a coefficient of linear thermal expansion close to that of the light emitting element. The lower limit of the thickness of the base member may be appropriately selected. From the point of view of the strength of the base member, the thickness of the base member is preferably 0.05 mm or greater, and is more preferably 0.2 mm or greater. From the point of view of the thickness (i.e., depth in the Z direction) of the light emitting device, the thickness of the base member is preferably 0.5 mm or less, and is more preferably 0.4 mm or less.

First Wiring Portions 12

The first wiring portions are disposed on the front surface of the base member, and is electrically connected with the light emitting element. The first wiring portions may be made of material comprising copper, iron, nickel, tungsten, chromium, aluminum, silver, gold, titanium, palladium, rhodium, or an alloy thereof. The first wiring portions may be in a single layer or has a layered structure of the metal materials described above and alloys thereof. From the point of view of, especially, the heat dissipation, it is preferable to use copper or a copper alloy. The first wiring portions may include a surface layer of, for example, silver, platinum, aluminum, rhodium, gold or an alloy thereof from the point of view of, for example, wettability on the conductive bonding member and/or the light reflectance.

Second Wiring Portions 13

Each of the second wiring portions is electrically connected with the corresponding one of the first wiring portions, and covers an inner wall of the recessed portion of the base member. The second wiring portion may be made of a conductive material substantially the same as that of the first wiring portions.

Light Emitting Element 20 (First Light Emitting Element 20A, Second Light Emitting Element 20B)

The light emitting element is a semiconductor element configured to emit light when a voltage is applied. For the light emitting element, a known semiconductor element formed of a nitride semiconductor or the like can be used. The light emitting element may be, for example, an LED chip. The light emitting element includes at least a semiconductor layer, and electrodes. The electrodes may be made of gold, silver, tin, platinum, rhodium, titanium, aluminum, tungsten, palladium, nickel or an alloy thereof.

A preferable material for the semiconductor layer may be a nitride semiconductor. The nitride semiconductor is generally expressed by general formula $In_xAl_yGa_{1-x-y}N$ ($0 \leq x$, $0 \leq y$, $x+y \leq 1$). Other examples of material usable for the semiconductor layer include an InAlGaAs-based semiconductor, an InAlGaP-based semiconductor, zinc sulfide, zinc selenide, silicon carbide and the like.

In many cases, the light emitting element further includes an element substrate (i.e., the element substrate 24). The element substrate of the light emitting element is generally a substrate for crystal growth, from which a semiconductor crystal forming the semiconductor layer may grow. Alternatively, the element substrate may be another substrate, on which the semiconductor element structure that has been separated from the substrate for crystal growth. The element substrate may be light-transmissive, thereby enabling flip-chip mounting and exhibition of improved light extraction efficiency. The element substrate may be a substrate mainly containing sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferable. The thickness of the element substrate may be appropriately selected, and is, for example, 0.02 mm or greater and 1 mm or less. From the point of view of the strength of the element substrate and/or the thickness of the light emitting device, it is preferable that the thickness of the element substrate is 0.05 mm or greater and 0.3 mm or less.

Reflective Member 40

The reflective member covers the lateral surfaces 202 of the light emitting element 20 and the top surface 111 of the base member, and thus provides a highly clear border between a light emitting region and a non-light emitting region in the light emitting device. At the emission peak wavelength of the light emitting element, the reflective member has a light reflectance of preferably 70% or higher, more preferably 80% or higher, and still more preferably 90% or higher. For example, the reflective member may be formed of a resin material containing a white pigment.

Light-Transmissive Member 30, 30A, 30B

The light-transmissive member covers the light extraction surface of the light emitting element and protects the light emitting element. The light-transmissive member may be formed of, for example, a resin. Examples of the resin usable for the light-transmissive member include a silicone resin, an epoxy resin, a phenol resin, a polycarbonate resin, an acrylic resin, and a modified resin thereof. As the material of the light-transmissive member, an epoxy resin is preferable because use of an epoxy resin can improve the strength of the light emitting device than use of a silicone resin. A silicone resin and a modified resin thereof, which are highly resistant against heat and light, are also preferable as the material of the light-transmissive member. The light-transmissive member may contain wavelength conversion particles and/or diffusive particles.

Wavelength Conversion Particles

The wavelength conversion particles absorb at least a part of primary light emitted by the light emitting element and emit secondary light having a wavelength different from that of the primary light. The wavelength conversion particles may be formed of one material or a combination of two or more materials among the examples shown below. In the case where the light-transmissive member includes a plurality of wavelength conversion layers, the wavelength conversion layers may contain wavelength conversion particles of the same material as each other or wavelength conversion particles of different materials from each other.

Examples of materials of the wavelength conversion particles emitting green light include a yttrium-aluminum-garnet-based phosphor (e.g., $Y_3(Al, Ga)_5O_{12}$: Ce), a lutetium-aluminum-garnet-based phosphor (e.g., $Lu_3(Al, Ga)_5O_{12}$: Ce), a terbium-aluminum-garnet-based phosphor (e.g., $Tb_3(Al, Ga)_5O_{12}$: Ce), a silicate-based phosphor (e.g., $(Ba, Sr)_2SiO_4$: Eu), a chlorosilicate-based phosphor (e.g., $Ca_8Mg(SiO_4)_4Cl_2$: Eu), a β-SiAlON-based phosphor (e.g., $Si_{6-z}Al_zO_zN_{8-z}$: Eu ($0<z<4.2$)), an SGS-based phosphor (e.g., $SrGa_2S_4$: Eu), an alkaline earth alminate-based phosphor (e.g., $(Ba, Sr, Ca)Mg_xAl_{10}O_{16+x}$: Eu, Mn ($0 \leq x \leq 1$), and the like. Examples of materials of the wavelength conversion particles emitting yellow light include an α-SiAlON-based phosphor (e.g., $M_z(Si, Al)_{12}(O, N)_{16}$ ($0<z\leq 2$; M is Li, Mg, Ca, Y, or a lanthanide element excluding La and Ce), and the like. The above-described examples of material of the wavelength conversion particles emitting green light include a material usable for the wavelength conversion particles emitting yellow light. For example, the yttrium-aluminum-garnet-based phosphor may have a part of Y replaced with Gd, so that the emission peak wavelength is shifted toward the longer side so as to emit yellow light. The above-described examples of material of the wavelength conversion particles emitting yellow light include a material usable for wavelength conversion particles emitting orange light. Examples of materials of the wavelength conversion particles emitting red light include a nitrogen-containing calcium aluminosilicate (e.g., CASN or SCASN)-based phosphor (e.g., $(Sr, Ca)AlSiN_3$: Eu), a SLAN phosphor ($SrLiAl_3N_4$: Eu), and the like. Another example of material of the wavelength conversion particles emitting red light may be a manganese-activated fluoride-based phosphor (i.e., phosphor represented by general formula (I): $A_2[M_{1-a}Mn_aF_6]$ (in general formula (I), "A" is at least one selected from the group consisting of K, Li, Na, Rb, Cs and $NH_4$; "M" is at least one element selected from the group consisting of the group IV elements and the group XIV elements; and "a" satisfies $0<a<0.2$)). A representative example of the manganese-activated fluoride-based phosphor is a phosphor of manganese-activated potassium fluorosilicate (e.g., $K_2SiF_6$: Mn).

Diffusive Particles

Examples of materials of the diffusive particles include silicon oxide, aluminum oxide, zirconium oxide, zinc oxide, and the like. The diffusive particles may be formed of a single material or a combination of two or more materials among these materials. It is especially preferable to use silicon oxide, which has a small coefficient of thermal expansion. As the diffusive particles, nanoparticles may be used. In this case, light emitted by the light emitting element is more scattered, which can reduce the amount of the wavelength conversion particles to be used. The "nanoparticle" refers to a particle having a particle diameter of 1 nm or longer and 100 nm or shorter. In this specification, the "particle diameter" is defined by, for example, $D_{50}$.

Light Guide Member 50

The light guide member bonds the light emitting element and the light-transmissive member to each other, and guides the light from the light emitting element to the light-transmissive member. Examples of the base material of the light guide member are a silicone resin, an epoxy resin, a phenol resin, a polycarbonate resin, an acrylic resin and a modified resin thereof. As the material of the light guide member, an epoxy resin is preferable because use of an epoxy resin can improve the strength of the light emitting device than use of a silicone resin. A silicone resin and a modified resin thereof, which are highly resistant against heat and light, are also preferable as the material of the light guide member. The light guide member may contain wavelength conversion particles and/or diffusive particles substantially the same as or similar to those of the light-transmissive member described above.

Conductive Bonding Member 60

Each of the conductive bonding members electrically connects an electrode of the light emitting element and a corresponding first wiring portion to each other. The conductive bonding members may be any one of: bumps mainly containing gold, silver, copper or the like; metal pastes containing a resin binder and metal powder of silver, gold, copper, platinum, aluminum, palladium or the like; solder based on tin-bismuth, tin-copper, tin-silver, gold-tin or the like; and a brazing material of a low melting-point metal material; and the like.

A light emitting device according to an embodiment of the present disclosure can be used for, for example, backlight devices of liquid crystal display devices; various lighting devices; large-scale displays; various display devices for advertisements, destination guides and the like; projector devices; and image reading devices for digital video cameras, facsimiles, copiers, scanners and the like.

While certain embodiments of the present invention has been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A method of producing a light source device, comprising the steps of:
   providing a light emitting device comprising:
      a substrate including a base member having:
         a front surface extending in a longitudinal direction and a short-side direction perpendicular to the longitudinal direction,
         a rear surface positioned opposite to the front surface,
         a top surface adjacent to the front surface and perpendicular to the front surface,
         a bottom surface positioned opposite to the top surface, and
         a plurality of recessed portions opened on the rear surface and the bottom surface,
      the substrate further including:
         a first wiring portion located on the front surface, and
         a second wiring portion electrically connected with the first wiring portion and located in the plurality of recessed portions; and
      a light emitting element electrically connected with the first wiring portion, and located on the first wiring portion;
   providing a support substrate including a support base member, a first wiring pattern located on a top surface of the support base member and including a joining region, and an insulating region enclosing the joining region;
   applying a solder member directly on the joining region and the insulating region such that a portion of the solder member positioned on the insulating region has a maximum width wider than a maximum width of a portion of the solder member positioned on the joining region as seen in a plan view;
   placing the light emitting device on the support substrate while the solder member and a portion of the second wiring portion that is positioned in the vicinity of the bottom surface are separate from each other as seen in a plan view; and
   joining the second wiring portion of the light emitting device and the joining region of the support substrate to each other by melting the solder member through heating.

2. The method of producing a light source device of claim 1, wherein each of the plurality of recessed portions has a first depth defined from the rear surface to the front surface on a side close to the bottom surface and a second depth defined from the rear surface to the front surface on a side close to the top surface, the first depth being greater than the second depth.

3. The method of producing a light source device of claim 1, wherein the substrate of the light emitting device and the support substrate are joined to each other by an adhesive resin.

4. The method of producing a light source device of claim 2, wherein the substrate of the light emitting device and the support substrate are joined to each other by an adhesive resin.

5. The method of producing a light source device of claim 3, wherein the step of joining the second wiring portion of the light emitting device and the joining region of the support substrate to each other includes curing the adhesive resin.

6. The method of producing a light source device of claim 4, wherein the step of joining the second wiring portion of the light emitting device and the joining region of the support substrate to each other includes curing the adhesive resin.

7. The method of producing a light source device of claim 3, wherein the adhesive resin is positioned between the plurality of recessed portions.

8. The method of producing a light source device of claim 4, wherein the adhesive resin is positioned between the plurality of recessed portions.

9. The method of producing a light source device of claim 5, wherein the adhesive resin is positioned between the plurality of recessed portions.

10. The method of producing a light source device of claim 6, wherein the adhesive resin is positioned between the plurality of recessed portions.

11. The method of producing a light source device of claim 1, wherein the plurality of recessed portions each have a maximum width narrower than a maximum width of the joining region as seen in a plan view.

12. The method of producing a light source device of claim 2, wherein the plurality of recessed portions each have a maximum width narrower than a maximum width of the joining region as seen in a plan view.

13. The method of producing a light source device of claim 3, wherein the plurality of recessed portions each have a maximum width narrower than a maximum width of the joining region as seen in a plan view.

14. The method of producing a light source device of claim 4, wherein the plurality of recessed portions each have a maximum width narrower than a maximum width of the joining region as seen in a plan view.

15. The method of producing a light source device of claim 5, wherein the plurality of recessed portions each have a maximum width narrower than a maximum width of the joining region as seen in a plan view.

16. The method of producing a light source device of claim 6, wherein the plurality of recessed portions each have a maximum width narrower than a maximum width of the joining region as seen in a plan view.

17. The method of producing a light source device of claim 7, wherein the plurality of recessed portions each have a maximum width narrower than a maximum width of the joining region as seen in a plan view.

18. The method of producing a light source device of claim 8, wherein the plurality of recessed portions each have a maximum width narrower than a maximum width of the joining region as seen in a plan view.

19. The method of producing a light source device of claim 9, wherein the plurality of recessed portions each have a maximum width narrower than a maximum width of the joining region as seen in a plan view.

20. The method of producing a light source device of claim 10, wherein the plurality of recessed portions each have a maximum width narrower than a maximum width of the joining region as seen in a plan view.

* * * * *